(12) United States Patent
Boehm et al.

(10) Patent No.: US 11,720,443 B2
(45) Date of Patent: *Aug. 8, 2023

(54) ERROR CORRECTION MANAGEMENT FOR A MEMORY DEVICE

(71) Applicant: Micron Technology, Inc., Boise, ID (US)

(72) Inventors: Aaron P. Boehm, Boise, ID (US); Scott E. Schaefer, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 17/518,160

(22) Filed: Nov. 3, 2021

(65) Prior Publication Data

US 2022/0058084 A1 Feb. 24, 2022

Related U.S. Application Data

(63) Continuation of application No. 16/578,094, filed on Sep. 20, 2019, now Pat. No. 11,182,244.

(Continued)

(51) Int. Cl.
*G06F 11/10* (2006.01)
*G11C 11/409* (2006.01)
*G06F 12/14* (2006.01)

(52) U.S. Cl.
CPC ........ *G06F 11/1068* (2013.01); *G06F 11/102* (2013.01); *G06F 11/1016* (2013.01); *G06F 12/1425* (2013.01); *G11C 11/409* (2013.01)

(58) Field of Classification Search
None
See application file for complete search history.

(56) References Cited

U.S. PATENT DOCUMENTS 5,392,301 A 2/1995 Fukushima
7,328,377 B1 * 2/2008 Lewis ............... G06F 11/106
714/48

(Continued)

OTHER PUBLICATIONS

ISA/KR, International Search Report and Written Opinion of the International Searching Authority, Int'l. Appl. No. PCT/US2019/054763, dated Jan. 23, 2020, Korean Intellectual Property Office, Seo-gu, Daejeon, Republic of Korea, 11 pgs.

(Continued)

*Primary Examiner* — Guerrier Merant
(74) *Attorney, Agent, or Firm* — Holland & Hart LLP

(57) ABSTRACT

Methods, systems, and devices for error correction management are described. A system may include a memory device that supports internal detection and correction of corrupted data, and whether such detection and correction functionality is operating properly may be evaluated. A known error may be included (e.g., intentionally introduced) into either data stored at the memory device or an associated error correction codeword, among other options, and data or other indications subsequently generated by the memory device may be evaluated for correctness in view of the error. Thus, either the memory device or a host device coupled with the memory device, among other devices, may determine whether error detection and correction functionality internal to the memory device is operating properly.

19 Claims, 15 Drawing Sheets

Related U.S. Application Data

(60) Provisional application No. 62/746,295, filed on Oct. 16, 2018.

(56) References Cited

U.S. PATENT DOCUMENTS

| | | | | |
|---|---|---|---|---|
| 9,865,362 | B1* | 1/2018 | Arora | G11C 29/02 |
| 11,182,244 | B2* | 11/2021 | Boehm | G11C 29/02 |
| 2002/0157044 | A1* | 10/2002 | Byrd | H04L 1/24 |
| | | | | 714/703 |
| 2002/0178411 | A1* | 11/2002 | Kohda | H04L 69/08 |
| | | | | 375/213 |
| 2003/0085731 | A1* | 5/2003 | Iwase | G11C 29/46 |
| | | | | 326/16 |
| 2003/0188251 | A1 | 10/2003 | Brown et al. | |
| 2005/0086572 | A1 | 4/2005 | Hirabayashi | |
| 2012/0194249 | A1* | 8/2012 | Haga | G01R 31/318594 |
| | | | | 327/270 |
| 2012/0266033 | A1 | 10/2012 | Gold et al. | |
| 2013/0246895 | A1 | 9/2013 | Laurent et al. | |
| 2013/0346798 | A1 | 12/2013 | Moyer | |
| 2015/0067448 | A1 | 3/2015 | Son et al. | |
| 2015/0074487 | A1 | 3/2015 | Patapoutian et al. | |
| 2015/0127867 | A1* | 5/2015 | Takahashi | G06F 13/24 |
| | | | | 710/269 |
| 2016/0253239 | A1 | 9/2016 | Um | |
| 2016/0276035 | A1 | 9/2016 | So et al. | |
| 2016/0378597 | A1 | 12/2016 | Chung et al. | |
| 2017/0257121 | A1 | 9/2017 | Kwok | |
| 2018/0331692 | A1* | 11/2018 | Gulati | H03M 13/6566 |
| 2019/0088349 | A1 | 3/2019 | Pyo et al. | |

OTHER PUBLICATIONS

European Search Report received for EP Patent Application No. 19873424.6, dated Feb. 4, 2022, 15 pages.

* cited by examiner

ERROR CORRECTION MANAGEMENT FOR A MEMORY DEVICE

CROSS REFERENCE

The present Application for Patent is a continuation of U.S. patent application Ser. No. 16/578,094 by Boehm et al., entitled "ERROR CORRECTION MANAGEMENT FOR A MEMORY DEVICE," filed Sep. 20, 2019, which claims priority to U.S. Provisional Patent Application No. 62/746, 295 by Boehm et al., entitled "ERROR CORRECTION MANAGEMENT FOR A MEMORY DEVICE," filed Oct. 16, 2018, each of which is assigned to the assignee hereof and each of which is expressly incorporated by reference in its entirety.

BACKGROUND

The following relates generally to error correction management and more specifically to error correction management for a memory device.

Memory devices are widely used to store information in various electronic devices such as computers, wireless communication devices, cameras, digital displays, and the like. Information is stored by programing different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Types of memory devices include magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, SRAM, may lose their stored state when disconnected from an external power source. Dynamic memory devices, e.g., DRAM, SDRAM, may lose a stored state over time unless they are periodically refreshed.

In some cases, data stored within a memory device may become corrupted. Some memory devices may be configured to internally correct such data corruption or errors (e.g., data errors) and thereby recover the data as stored before corruption. Such memory devices may be referred to as error-correcting code (ECC) memory. Improved techniques for determining whether the ECC functionality within an ECC memory device is operating properly may be desired.

DETAILED DESCRIPTION

Figure 1:
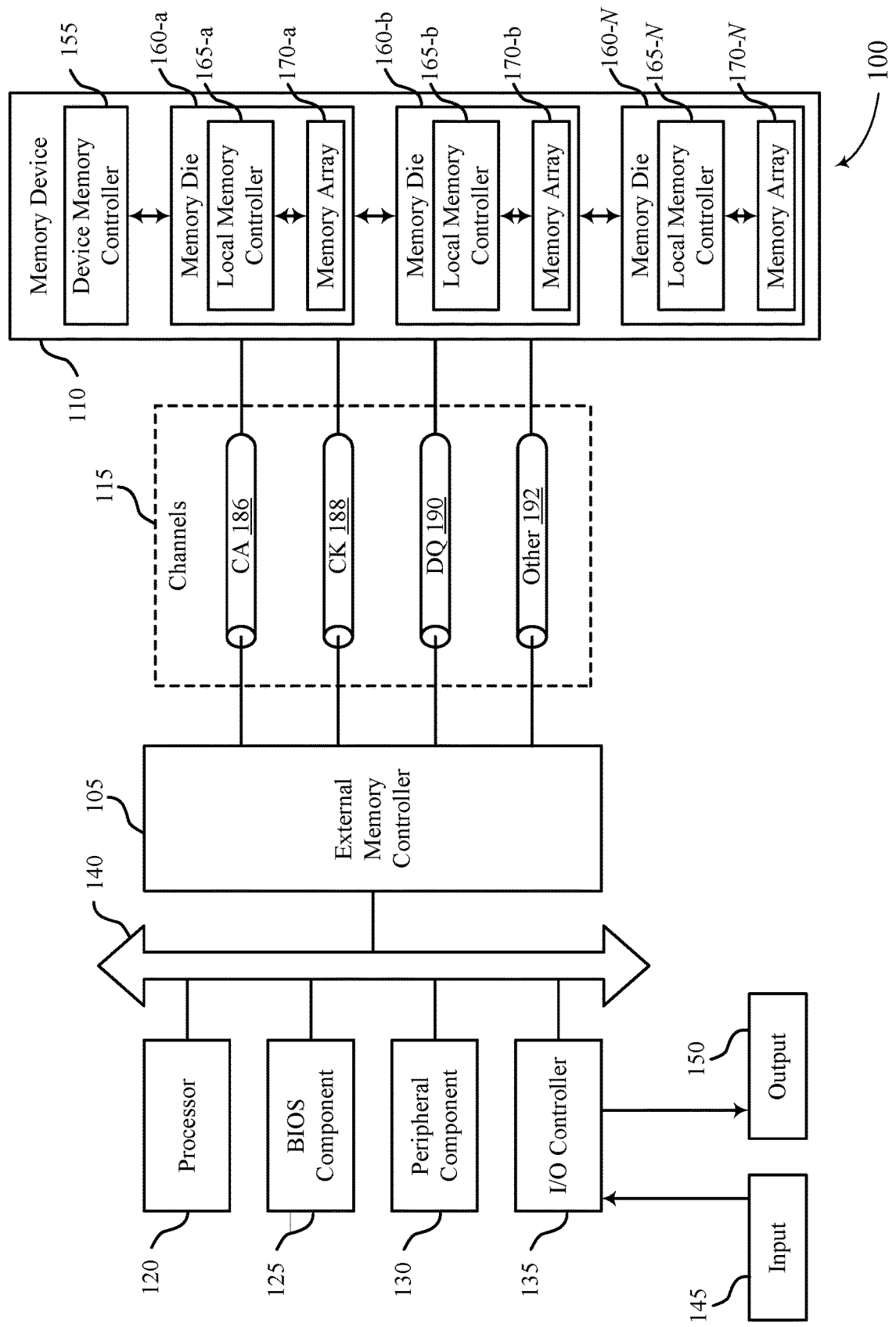
FIG. 1 illustrates an example of a memory array that supports error correction management in accordance with examples as disclosed herein.

Memory devices may operate under various conditions as part of electronic apparatuses such as personal computers, wireless communication devices, servers, internet-of-things (IoT) devices, electronic components of automotive vehicles, and the like. In some cases, memory devices supporting applications for certain implementations (e.g., automotive vehicles, in some cases with autonomous or semi-autonomous driving capabilities) may be subject to increased reliability constraints. As such, memory devices (e.g., dynamic random access memory (DRAM)) for some applications (e.g., automotive applications) may be expected to operate with a reliability subject to relatively higher industry specifications (e.g., higher reliability constraints).

Data stored in a memory device may in some cases become corrupted (e.g., due to electromagnetic interference (EMI)). Corruption of data may refer to an unintentional change in the logic value of data as stored within the memory device and thus may refer to an unintended change in the logic value stored by one or more memory cells (e.g., from a logic one (1) to a logic zero (0), or vice versa). A deviation in the stored logic value of a bit from its original and intended logic value may be referred as an error, a bit error, or a data error and may result from corruption.

Some memory devices may be configured to internally detect and in at least some cases correct (repair) such data corruption or errors and thereby recover the data as stored before corruption. Such error detection and correction may rely upon one or more error-correcting codes (ECCs) (e.g., Hamming codes), and related processes, procedures, and techniques thus may be referred as ECC processes, ECC procedures, ECC techniques, or in some cases as simply ECC. ECC conducted internally within a memory device may generally be referred to as on-die ECC (whether within a single-die memory device or a multi-die memory device), and memory devices that support on-die ECC may be referred to as ECC memory.

Verifying whether on-die ECC is operating properly within a memory device may be desirable in certain applications (e.g., automotive applications or other applications with heightened reliability constraints), as proper operation of on-die ECC may enhance the reliability of a system, while improper operation of on-die ECC may reduce the reliability of a system (e.g., due to failure to repair data errors and/or misplaced reliance on the on-die ECC by a host device or other aspects of the system). Improper operation of on-die ECC within a memory device may include a failure to detect or correct a data error, or false positives (e.g., indications of a detected error when no such error exists, alteration of data through a "correction" ("repair") procedure where the stored data is not erroneous).

Techniques for verifying whether on-die ECC is operating properly within a memory device are described. Such techniques may support determination of whether ECC procedures within a memory device are operating properly. Accordingly, such techniques may be diagnostic techniques and may enable a host device to either confirm that the ECC procedures within a memory device are operating properly or detect a failure of the ECC procedures within a memory device, thereby enhancing the reliability of the system.

In some examples, upon receiving a write command for data, an ECC memory device in a normal (regular) operating mode may generate an associated codeword (e.g., a first codeword) based on the data using an ECC. The memory device may store the data in a first location (e.g., a data array or sub-array) and may store the associated codeword in a second location (e.g., a different array or sub-array, which may be referred to as an ECC array or sub-array). Upon subsequently receiving a read command for the data, the memory device may perform an ECC procedure. As part of the ECC procedure, the memory device may generate a new codeword (e.g., a second codeword) based on the data as retrieved from the first location and using the same error-correcting code previously used to generate the first codeword.

If the first and second codewords match, the memory device may determine that the data is not corrupt (e.g., no errors exist). If the first and second codewords do not match, the ECC procedure may determine that the data is corrupt (e.g., at least one error exists). Depending on the strength of the error-correcting code, the ECC procedure may—if operating properly—be able to correct or detect some quantity of bits errors. For example, if the ECC is a single error-correcting code (SEC) or a single error-correcting double error-detecting code (SECDED), the error correcting procedure may be able to detect the occurrence of a single bit error (one bit in the data is corrupted) and correct the single bit error (determine the original, uncorrupted value of the data and perform one or more subsequent operations based on the original value of the data). As another example, if the error-correcting code is a single error-correcting double error-detecting code (SECDED), the error correcting procedure may be able to detect the occurrence of a double bit error (two bits in the data are corrupted) but may not be able to correct the double bit error, and the memory device may indicate (e.g., to the host device) the occurrence of the double bit error.

To verify that on-die ECC is operating properly, an intentional error (mismatch) may be introduced into either data stored in the memory device or into an associated codeword. For example, an intentional error may be introduced to the data or the associated codeword by altering (inverting) some quantity of bits (e.g., one or two bits) of the data or the associated codeword. An ECC procedure may thereafter be executed (e.g., in response to a read command for the data), and either the memory device or the host device may determine whether the output of the ECC procedure is correct in view of the intentional error. For example, if the intentional error was a single bit error, either the memory device or the host device may determine whether the output of the ECC procedure reflects the original value of the data before introduction of the intentional error (e.g., whether the ECC procedure properly repairs the intentional error). As another example, if the intentional error was a double bit error, either the memory device or the host device may determine whether the ECC procedure properly detects and indicates the existence of the double bit error.

Figure 2:
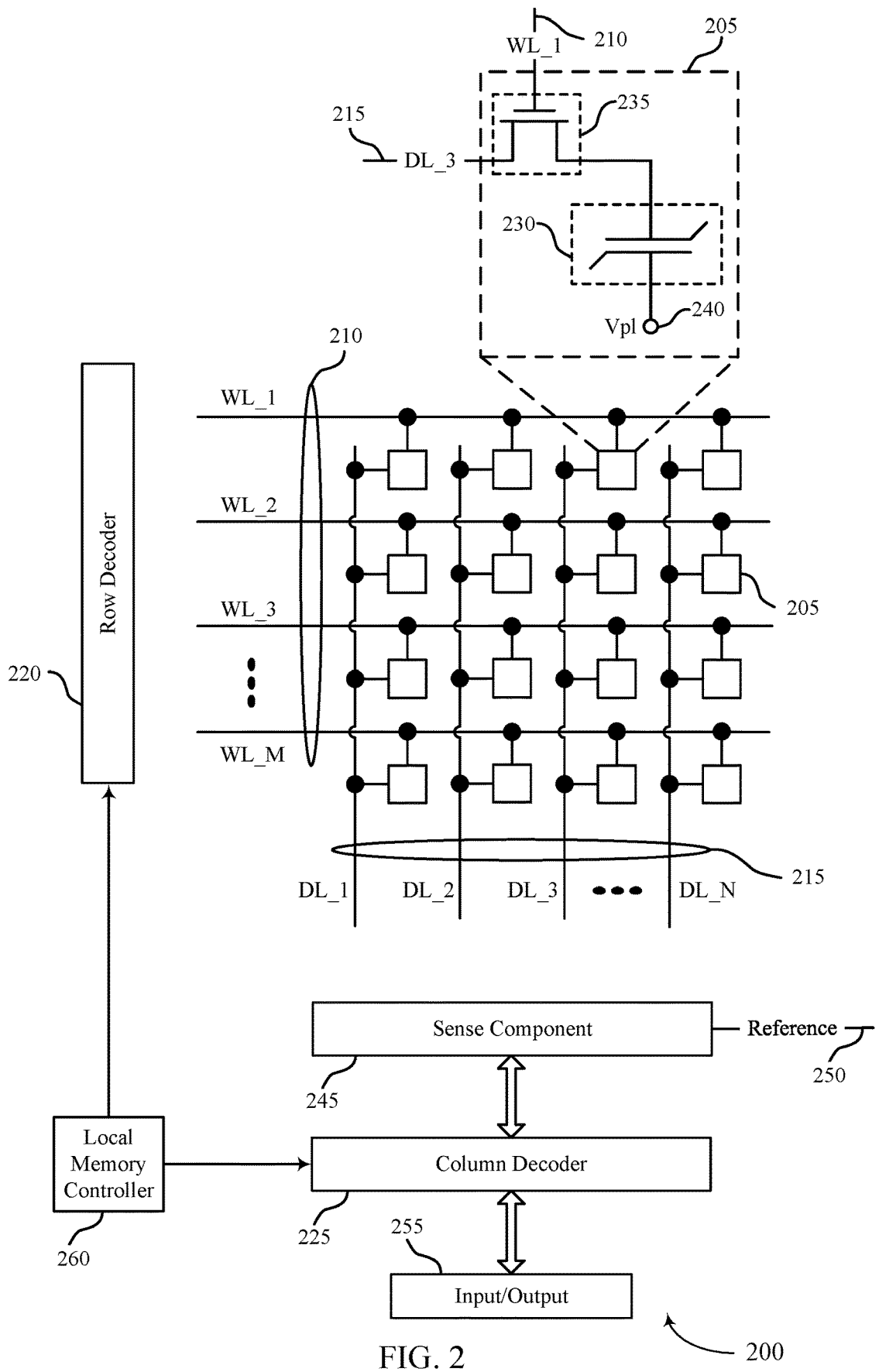
FIG. 2 illustrates an example of a circuit that supports error correction management in accordance with examples as disclosed herein.
Figure 3:
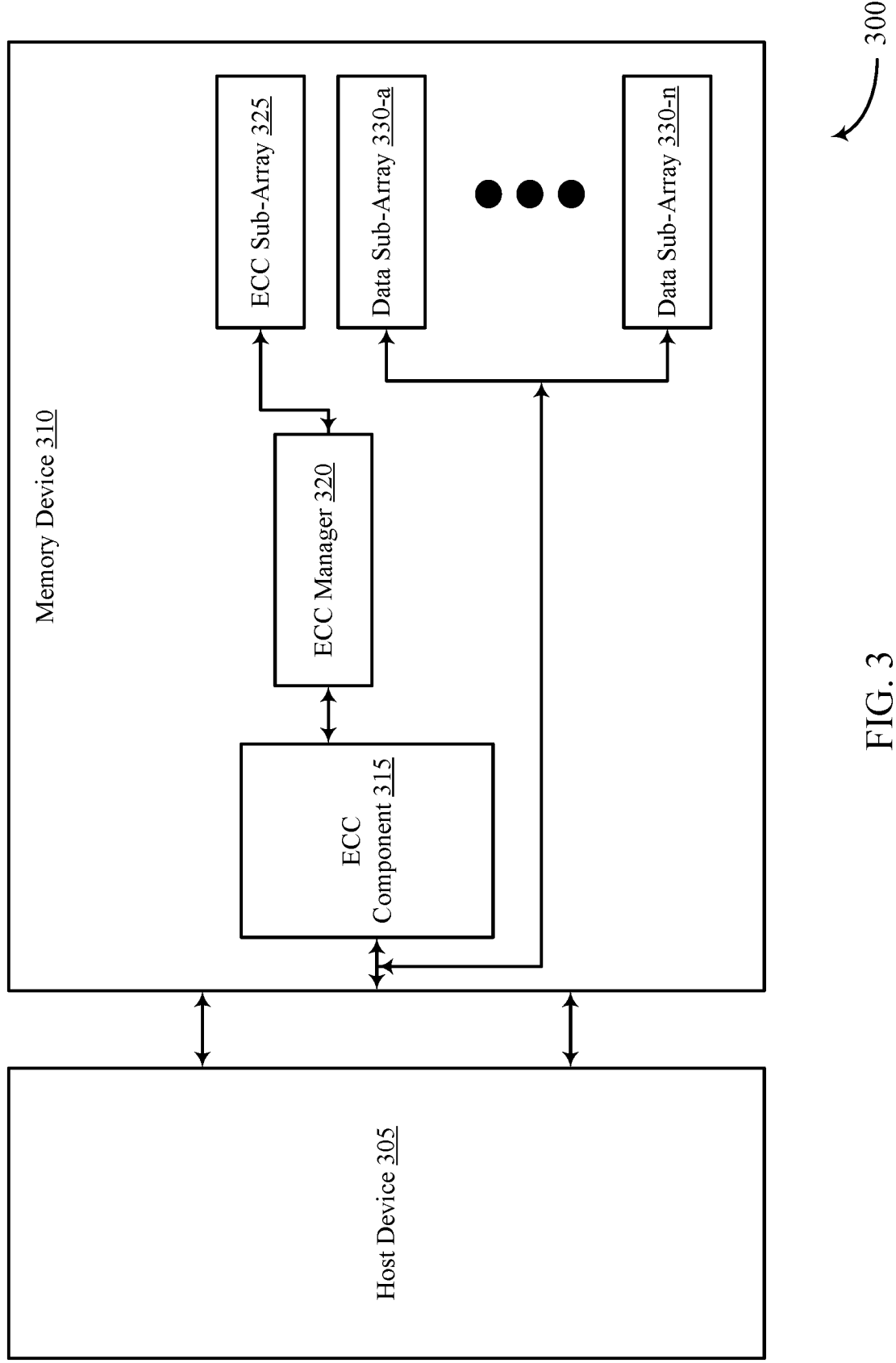
FIG. 3 illustrates an example of system that support error correction management in accordance with examples as disclosed herein.

Features of the disclosure are initially described in the context of memory systems and a memory device with reference to FIGS. 1-3. Features of the disclosure are described in the context of process flows with reference to FIGS. 4-6. These and other features of the disclosure are further illustrated by and described with reference to apparatus diagrams and flowcharts in FIGS. 7-15 that relate to error correction management.

FIG. 1 illustrates an example of a system 100 that utilizes one or more memory devices in accordance with aspects disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110. The memory device 110 may be an ECC memory device and may support on-die ECC.

The system 100 may include aspects of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100. In some examples, the system 100 is configured for bi-directional wireless communication with other systems or devices using a base station or access point. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some examples, system 100 is a graphics card. In some cases, the host device may refer to the hardware, firmware, software, or a combination thereof that implements the functions of the external memory controller 105. In some cases, the external memory controller 105 may be referred to as a host or host device.

In some cases, the memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as a multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), a general purpose GPU (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots. The peripheral component (s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein.

The memory device 110 may include a device memory controller 155 and one or more memory dice 160. Each memory die 160 may include a local memory controller 165 (e.g., local memory controller 165-a, local memory controller 165-b, and/or local memory controller 165-N) and a memory array 170 (e.g., memory array 170-a, memory array 170-b, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2. In some cases, the memory device may store data (datawords) in a first location, such a first array 170-a or portion thereof (sub-array) and may store associated codewords (ECC codewords) in a second location, such as a different portion (sub-array) of the first array 170-a or in a second array 170-b.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-a, memory die 160-b, and/or any quantity of memory dice 160-N). In a 3D memory device, a plurality of memory dice 160-N may be stacked on top of one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120).

In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some examples, the external memory controller 105 may be configured to initiate an ECC diagnostic procedure for the memory device 110. For example, the external memory controller 105 may be configured to switch the memory device 110 from a normal operating mode (access mode, mission mode) to an ECC diagnostic mode. With the memory device 110 in the ECC diagnostic mode, the external memory controller 105 may in some cases transmit an altered version of data previously written to the memory device 110, where the altered version of the data includes some quantity of intentional errors. In some cases, the memory device 110 may internally generate the altered version of the data or alter the associated codeword to include some quantity of intentional errors. The external memory controller 105 may transmit to the memory device 110 a read command for the data and evaluate whether the responsive signaling by the memory device 110 is appropriate in view of the intentional error(s) (e.g., whether responsive data provided by the memory device does or does not match the original, uncorrupted data, or whether the memory device properly detects and indicates the existence of a double bit error). The external memory controller 105 may determine whether the on-die ECC supported by the memory device 110 is operating properly based on whether the responsive signaling by the memory device 110 is appropriate in view of the intentional error(s).

In some cases, the memory device 110 may autonomously (e.g., on a scheduled basis or in response to a trigger event) engage in similar procedures as part of an ECC self-diagnostic procedure and may provide to the external memory controller 105 an indication of the result of the ECC self-diagnostic procedure (e.g., an indication of whether the memory device 110 has determined that its on-die ECC is operating properly).

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel. In some cases, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be x4 (e.g., including four signal paths), x8 (e.g., including eight signal paths), x16 (including sixteen signal paths), and so forth.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include eight or nine signal paths.

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended. In some cases, the clock signal may be a 1.5 GHz signal. A CK channel 188 may include any quantity of signal paths. In some cases, the clock signal CK (e.g., a CK_t signal and a CK_c signal) may provide a timing reference for command and addressing operations for the memory device 110, or other system-wide operations for the memory device 110. The clock signal CK therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110. The data channels 190 may communicate signals that may be modulated using a variety of different modulation schemes (e.g., non-return-to-zero (NRZ), pulse amplitude modulation (PAM) having four symbols (PAM4)).

In some cases, the channels 115 may include one or more other channels 192 that may be dedicated to other purposes. These other channels 192 may include any quantity of signal paths.

In some cases, the other channels 192 may include one or more write clock signal (WCK) channels. While the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured to coordinate an access operation (e.g., a write operation or read operation) of the external memory controller 105 and the memory device 110. In some cases, the write clock signal may be a differential output (e.g., a WCK_t signal and a WCK_c signal) and the signal paths of the WCK channels may be configured accordingly. A WCK channel may include any quantity of signal paths. The data clock signal WCK may be generated by a data clock, which may include one or more hardware components (e.g., oscillators, crystals, logic gates, transistors, or the like).

In some cases, the other channels 192 may include one or more error detection code (EDC) channels. The EDC channels may be configured to communicate error detection signals, such as checksums, to improve system reliability. An EDC channel may include any quantity of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of an M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, NRZ, unipolar encoding, bipolar encoding, Manchester encoding, PAM having two symbols (PAM2), and/or others.

In some cases, a multi-symbol (or multi-level) modulation scheme may be used to modulate signals communicated between the external memory controller 105 and the memory device 110. A multi-symbol modulation scheme may be an example of an M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM4, PAM having eight symbols (PAM8), etc., quadrature amplitude modulation (QAM), quadrature phase shift keying (QPSK), and/or others. A multi-symbol signal or a PAM4 signal may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

FIG. 2 illustrates an example of a memory sub-array 200 in accordance with various examples of the present disclosure. The memory sub-array 200 may be an example of at least a portion of the memory dice 160 described with reference to FIG. 1. In some cases, the memory sub-array 200 may be referred to as a memory die, memory chip, a memory device, or an electronic memory apparatus. For example, a memory device such as a memory chip may include multiple instances of sub-array 200, with additional row, address, bank, or bank group decoding used to select one or more sub-arrays from the multiple instances for access operations. The memory sub-array 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. In some cases, data stored by a memory cell 205 may become corrupted (e.g., a logic value of a bit stored by the memory cell 205 may unintentionally change, such as due to EMI).

Operations such as reading and writing may be performed on memory cells 205 by activating or selecting access lines such as a word line 210 and/or a digit line 215. In some cases, digit lines 215 may also be referred to as bit lines. References to access lines, word lines and digit lines, or their analogues, are interchangeable without loss of understanding or operation. Activating or selecting a word line 210 or a digit line 215 may include applying a voltage to the respective line or configuring a multiplexer to map the line to a given signal.

The memory sub-array 200 may include the access lines (e.g., the word lines 210 and the digit lines 215) arranged in a grid-like pattern. Memory cells 205 may be positioned at intersections of the word lines 210 and the digit lines 215. By biasing a word line 210 (e.g., applying a voltage to the word line 210), a memory cell 205 may be accessed via the digit line 215 at their intersection. In some cases, the memory sub-array 200 illustrated in FIG. 2 may store data (datawords), and another memory sub-array may store associated codewords (ECC codewords). In some cases, a first portion of the memory sub-array 200 illustrated in FIG. 2 may store data (datawords), and a second portion of the memory sub-array 200 may store associated codewords (ECC codewords).

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may select a digit line 215 based on the received column address. For example, the memory sub-array 200 may include multiple word lines 210, labeled WL_1 through WL_M, and multiple digit lines 215, labeled DL_1 through DL_N, where M and N depend on the size of the memory array. Thus, by activating a word line 210, e.g., WL_1, the memory cells 205 in a given row may be accessed. The digit lines 215 (e.g., DL_1, . . . , DL N) carry the data for writing or reading from the memory cells in the row. The intersection of a word line 210 and a digit line 215, in either a two-dimensional or three-dimensional configuration, may be referred to as an address of a memory cell 205.

The memory cell 205 may include a logic storage component, such as capacitor 230 and a switching component 235. The capacitor 230 may be an example of a dielectric capacitor or a ferroelectric capacitor. A first node of the capacitor 230 may be coupled with the switching component 235 and a second node of the capacitor 230 may be coupled with a voltage source 240. In some cases, the voltage source 240 may be the cell plate reference voltage, such as Vpl, or may be ground, such as Vss. In some cases, the voltage source 240 may be an example of a plate line coupled with a plate line driver. The switching component 235 may be an example of a transistor or any other type of switch device that selectively establishes or de-establishes electronic communication between two components.

Selecting or deselecting the memory cell 205 may be accomplished by activating or deactivating the switching component 235. The capacitor 230 may be in electronic communication with the digit line 215 using the switching component 235. For example, the capacitor 230 may be isolated from digit line 215 when the switching component 235 is deactivated, and the capacitor 230 may be coupled with digit line 215 when the switching component 235 is activated. In some cases, the switching component 235 is a transistor and its operation may be controlled by applying a voltage to the transistor gate, where the voltage differential between the transistor gate and transistor source may be greater or less than a threshold voltage of the transistor. In some cases, the switching component 235 may be a p-type transistor or an n-type transistor. The word line 210 may be in electronic communication with the gate of the switching component 235 and may activate/deactivate the switching component 235 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 235 of a memory cell 205 and may be configured to control the switching component 235 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be configured to couple and/or isolate the capacitor 230 of the memory cell 205 and the digit line 215. In some architectures, the memory cell 205 may be in electronic communication (e.g., constant) with the digit line 215.

The sense component 245 may be configured to detect a state (e.g., a charge) stored on the capacitor 230 of the memory cell 205 and determine a logic state of the memory cell 205 based on the stored state. The charge stored by a memory cell 205 may be extremely small, in some cases. As such, the sense component 245 may include one or more sense amplifiers to amplify the signal output by the memory cell 205. The sense amplifiers may detect small changes in the charge of a digit line 215 during a read operation and may produce signals corresponding to a logic state 0 or a logic state 1 based on the detected charge. During a read operation, the capacitor 230 of memory cell 205 may output a signal (e.g., via charge sharing) to its corresponding digit line 215. The signal may cause a voltage of the digit line 215 to change. The sense component 245 may be configured to compare the signal received from the memory cell 205 across the digit line 215 to a reference signal 250 (e.g., reference voltage). The sense component 245 may determine the stored state of the memory cell 205 based on the comparison. For example, in binary-signaling, if digit line 215 has a higher voltage than the reference signal 250, the sense component 245 may determine that the stored state of memory cell 205 is a logic 1 and, if the digit line 215 has a lower voltage than the reference signal 250, the sense component 245 may determine that the stored state of the memory cell 205 is a logic 0. The sense component 245 may include amplifiers (e.g., transistor amplifiers) to detect and amplify a difference in the signals. The detected logic state of memory cell 205 may be output through column decoder 225 as output 255. In some cases, the aspects of sense component 245 may be part of another component (e.g., a column decoder 225, row decoder 220). In some cases, the sense component 245 may be in electronic communication with the row decoder 220 or the column decoder 225.

The local memory controller 260 may control the operation of memory cells 205 through the various components (e.g., row decoder 220, column decoder 225, and sense component 245). The local memory controller 260 may be an example of the local memory controller 165 described with reference to FIG. 1. In some cases, aspects of the row decoder 220, column decoder 225, or sense component 245 may be co-located with the local memory controller 260. The local memory controller 260 may be configured to receive commands and/or data from an external memory controller 105 (or a device memory controller 155 described with reference to FIG. 1), translate the commands and/or data into information that can be used by the memory sub-array 200, perform one or more operations on the memory sub-array 200, and communicate data from the memory sub-array 200 to the external memory controller 105 (or the device memory controller 155) in response to performing the one or more operations.

The local memory controller 260 may generate row and column address signals to activate the target word line 210 and select the target digit line 215. The local memory controller 260 may also generate and control various voltages or currents used during the operation of the memory sub-array 200. In general, the amplitude, shape, or duration of an applied voltage or current discussed herein may be adjusted or varied and may be different for the various operations discussed in operating the memory sub-array 200.

In some cases, the local memory controller 260 may be configured to perform a write operation (e.g., a programming operation) on one or more memory cells 205 of the memory sub-array 200. During a write operation, a memory cell 205 of the memory sub-array 200 may be programmed to store a desired logic state. In some cases, a plurality of memory cells 205 may be programmed during a single write operation. The local memory controller 260 may identify a target memory cell 205 on which to perform the write operation. The local memory controller 260 may identify a target word line 210 and a target digit line 215 in electronic communication with the target memory cell 205 (e.g., the address of the target memory cell 205). The local memory controller 260 may activate the target word line 210 (e.g., applying a voltage to the word line 210), to access a row including the target memory cell 205. The local memory controller 260 may apply a specific signal (e.g., voltage) to the digit line 215 during the write operation to store a specific state (e.g., charge) in the capacitor 230 of the memory cell 205, the specific state (e.g., charge) may be indicative of a desired logic state.

In some cases, when in a first operating mode (e.g., an access mode, mission mode), the local memory controller 260 may cause a memory device 110 that includes the memory sub-array 200 to generate a codeword associated with data received in connection with a write command and store the codeword in association with the data. In some cases, when in a second operating mode (e.g., an ECC diagnostic mode), the local memory controller may support the introduction of an intentional error into stored data or an associated codeword in accordance with aspects of the techniques described herein. Altering the data or the codeword to include the intentional (known) error may allow for the local memory controller 260 or a host device to determine whether the memory device has properly executed a subsequent ECC procedure.

In some cases, the local memory controller 260 may be configured to perform a read operation (e.g., a sense operation) on one or more memory cells 205 of the memory sub-array 200. During a read operation, the logic state stored in a memory cell 205 of the memory sub-array 200 may be determined. In some cases, a plurality of memory cells 205 may be sensed during a single read operation. The local memory controller 260 may identify a target memory cell 205 on which to perform the read operation. The local memory controller 260 may identify a target word line 210 and a target digit line 215 in electronic communication with the target memory cell 205 (e.g., the address of the target memory cell 205). The local memory controller 260 may activate the target word line 210 (e.g., applying a voltage to the word line 210), to access a row including the target memory cell 205. The target memory cell 205 may transfer a signal to the sense component 245 in response to biasing the access lines. The sense component 245 may amplify the signal. The local memory controller 260 may fire the sense component 245 (e.g., latch the sense component) and thereby compare the signal received from the memory cell 205 to the reference signal 250. Based on that comparison, the sense component 245 may determine a logic state that is stored on the memory cell 205. The local memory controller 260 may communicate the logic state stored on the memory cell 205 to the external memory controller 105 (or the device memory controller 155) as part of the read operation (e.g., by selecting data read from digit lines 215 using column decoder 225).

In some cases, when in a first operating mode (e.g., an access mode, mission mode) as well as when in a second operating mode (e.g., an ECC diagnostic mode), the local memory controller 260 may cause a memory device 110 that includes the memory sub-array 200 to execute an ECC procedure in response to a read command. As part of the ECC procedure, the memory device 110 may attempt to detect an error in data subject to the read command, and in some cases the memory device 110 may attempt to repair (correct) the error by determining g the original, uncorrupted value of the data. In some cases, when in the second operating mode (e.g., an ECC diagnostic mode), the local memory controller 260 may cause the memory device 110 to introduce an intentional error into the data or an associated codeword when retrieving (reading) the data or the associated codeword from the memory sub-array 200 or another memory sub-array.

In some memory architectures, accessing the memory cell 205 may degrade or destroy the logic state stored in a memory cell 205. For example, a read operation performed in DRAM architectures may partially or completely discharge the capacitor of the target memory cell. The local memory controller 260 may perform a re-write operation or a refresh operation to return the memory cell to its original logic state. The local memory controller 260 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

FIG. 3 illustrates an example of a system 300 that supports error correction management as disclosed herein. The system 300 may implement aspects of the system 100 and memory sub-array 200. The system 300 may include a host device 305, which may implement aspects of an external memory controller 105 as described with reference to FIG. 1. The system 300 may further include a memory device 310, which may be an example of a memory device 110 as described with reference to FIG. 1.

The memory device 310 may support on-die ECC and thus may be configured to internally detect and correct data corruption errors (e.g., data errors). In some examples, the memory device 310 may include an ECC component 315, an ECC manager 320, and one or more arrays (e.g., sub-arrays) of memory cells (e.g., ECC sub-array 325, data sub-array 330-$a$, and data sub-array 330-$n$). Each of the ECC sub-array 325 and the data sub-arrays 330 may be an example of a memory array 170 as described with reference to FIG. 1 (or a portion thereof) or an example of a memory sub-array 200 as described with reference to FIG. 2 (or a portion thereof). Though the example of system 300 is illustrated as including one ECC sub-array 325, it is to be understood that any quantity of ECC sub-arrays are possible. In some examples, the memory device 310 may be configured to communicate with the host device 305 (e.g., over one or more channels 115 as described with reference to FIG. 1).

In some examples, the ECC component 315 may include one or more encoders and comparators (not shown) and may be configured to perform one or more aspects of an ECC procedure. For example, the memory device 310 may receive a write command from the host device 305 (e.g., via a CA channel 186) for data also received from the host device 305 (e.g., via a DQ channel 190). The memory device 310 may store the data in a memory array 330. The location at which the data is stored may be referred to as a first location. In some examples, the memory device 310 may also provide the data to the ECC component 315, which may generate a codeword (ECC codeword) corresponding to the data, which may be referred to as a first codeword. The ECC component 315 may generate the first codeword using an ECC of a variety of types. In some examples, the ECC component 315 may generate the first codeword using a linear error-correcting code, such as a Hamming code. For example, the first codeword may be generated using an SEC code, or a SECDEC code, and/or an H-matrix (e.g., a parity check matrix). The first codeword may be stored to the ECC sub-array 325, and the location where the codeword is stored may be referred to as a second location.

The memory device 310 may subsequently receive a read command from the host device 305 (e.g., via a CA channel 186) for the data stored at the first location. In response to the read command, the ECC component 315 may execute an error correction procedure in which the ECC component attempts to detect and possibly correct any errors (corruption) in the data as retrieved from the first location. For example, the ECC component 315 may generate a second codeword based on the data and compare the second codeword to the first codeword that was generated when the data was written the memory device 310. The ECC component 315 may generate the second codeword using the same ECC used to generate the first codeword. Accordingly, the second codeword matching (being identical to) the first codeword may indicate that the data is not corrupt (e.g., the data read from the data sub-array 330 is unchanged from when it was previously written). However, any differences between the two codewords may indicate that the data has been corrupted (contains one or more errors). Thus, the ECC component 315 may determine whether one or more errors exist in the data based on comparing the second codeword to the first codeword. In some cases, the ECC component 315 may further attempt to repair (correct) a detected error (e.g., may attempt to recreate the data as it was when the first codeword was generated).

The type of ECC used to generate the first codeword and the second codeword may determine an amount of errors (e.g., data errors) that may be detected or corrected by the ECC component 315. For example, if the ECC is a SEC, the ECC component 315 may—when operating properly—be capable of repairing a single bit error associated with the data and may be configured to execute a related repair operation.

If the error correcting code is a SECDED, the ECC component 315 may further be capable of detecting the occurrence of a double bit error (e.g., distinguishing between a single bit error and a double bit error, and between a double bit error and a greater quantity of bit errors). In the event of a single bit error, the ECC component 315 may—when operating properly—repair the single bit error. In the event of a double bit error, the ECC component 315 may—when operating properly—provide an indication of the existence of the double bit error, which the memory device 310 may transmit to the host device 305.

As described herein, in order to increase the reliability of the system 300, it may be beneficial for the host device 305 or the memory device 310 to determine whether the on-die ECC of the memory device 310 is operating properly. The memory device 310 may support a mode of operation or procedure for determining whether the on-die ECC of the memory device 310 is operating properly, which may be referred to as an ECC diagnostic mode or procedure. In some cases, the host device 305 may cause the memory device 310 to enter an ECC diagnostic mode or otherwise execute an ECC diagnostic procedure by transmitting related commands (e.g., signaling) to the memory device. In some cases, the host device 305 may cause the memory device 310 to enter an ECC diagnostic mode or otherwise execute an ECC diagnostic procedure by setting one or more mode register bits at the memory device 310. In some cases, the memory device 310 may enter an ECC diagnostic mode or otherwise execute an ECC diagnostic procedure based on a schedule (e.g., periodic schedule, elapsed time since a prior ECC diagnostic procedure) or a trigger event (e.g., a boot or reboot of the memory device 310).

The ECC manager 320 may be coupled with the ECC component 315 and may support an ECC diagnostic procedure as described herein. The ECC manager 320 may receive codewords generated by and received from the ECC component 315 and may process such codewords based on an operating mode of the memory device 310. In some cases, the ECC manager may determine the operating mode of the memory device based on one or more bits stored in a mode register. When the memory device 310 is in a first operating mode (e.g., an access mode, mission mode, normal mode, regular mode), the ECC manager 320 may cause a codeword received from the ECC component to be stored in the ECC sub-array 325. When the memory device 310 is in the first operating mode and receives a subsequent read command for data associated with the codeword, the ECC manager 320 may retrieve the codeword (first codeword) from the ECC sub-array 325 and send the codeword to the ECC component 315 for comparison against a newly generated codeword based on the associated data (second codeword).

When the memory device 310 is in a second operating mode (e.g., an ECC diagnostic mode) or is otherwise executing an ECC diagnostic procedure, the ECC manager 320 may alter its operation accordingly so as to support the introduction of an intentional error (mismatch) in either a codeword or data associated with the codeword. For example, the ECC manager 320 the ECC manager 320 may alter one or more aspects of the codeword after it has been stored to the ECC sub-array 325 (e.g., as it is retrieved from the ECC sub-array 325 during a read operation). As another example, the ECC manager 320 may alter one or more aspects of the codeword before it is written (e.g., stored) to the ECC sub-array 325. In yet another example, the ECC manager 320 may block one or more codewords from being stored to the ECC sub-array 325, which may support alteration of data stored in a data sub-array 330 without a corresponding change in the associated codeword stored in the ECC sub-array 325. Altering data or a codeword may include altering (inverting) one or more bits of the data or codeword. For example, a bit that was previously a "1" may be altered (e.g., inverted) to a "0," or vice versa.

Thus, the ECC manager 320 may function differently based on a particular operating mode of the memory device 310. In some examples, the ECC manager 320 may receive a signal from a mode register (not shown) or from the host device 305 indicating a particular mode of operation. For example, a first mode of operation (access mode, mission mode) may indicate to the ECC manager 320 that codewords generated by the ECC component 315 or retrieved from the ECC sub-array should be passed through (relayed) by ECC manager 320 without being altered. Stated another way, in some examples the ECC manager 320 may be disabled (e.g., based on receiving a signal from a mode register and/or the host device 305) in the first mode of operation. As another example, a second mode of operation (ECC diagnostic mode) may indicate to the ECC manager 320 that one or more codewords should be prevented (e.g., blocked) from being stored to the ECC sub-array 325, which may include discarding the one or more codewords. As another example, in the second mode of operation, the ECC manager 320 may alter one or more aspects (e.g., one or more bits) of a codeword before the codeword is stored to the ECC sub-array 325 or may alter one or more aspects (e.g., one or more bits) of a codeword after the codeword is accessed from (e.g., read from) the ECC sub-array 325. The ECC manager may alter a codeword by inverting any quantity (one, some, or all) of the bits of the codeword or by changing any quantity (one, some, or all) of the bits of the codeword to a desired value (e.g., changing the codeword to all ones or all zeroes or to have some known patter, such as alternating values).

Figure 4:
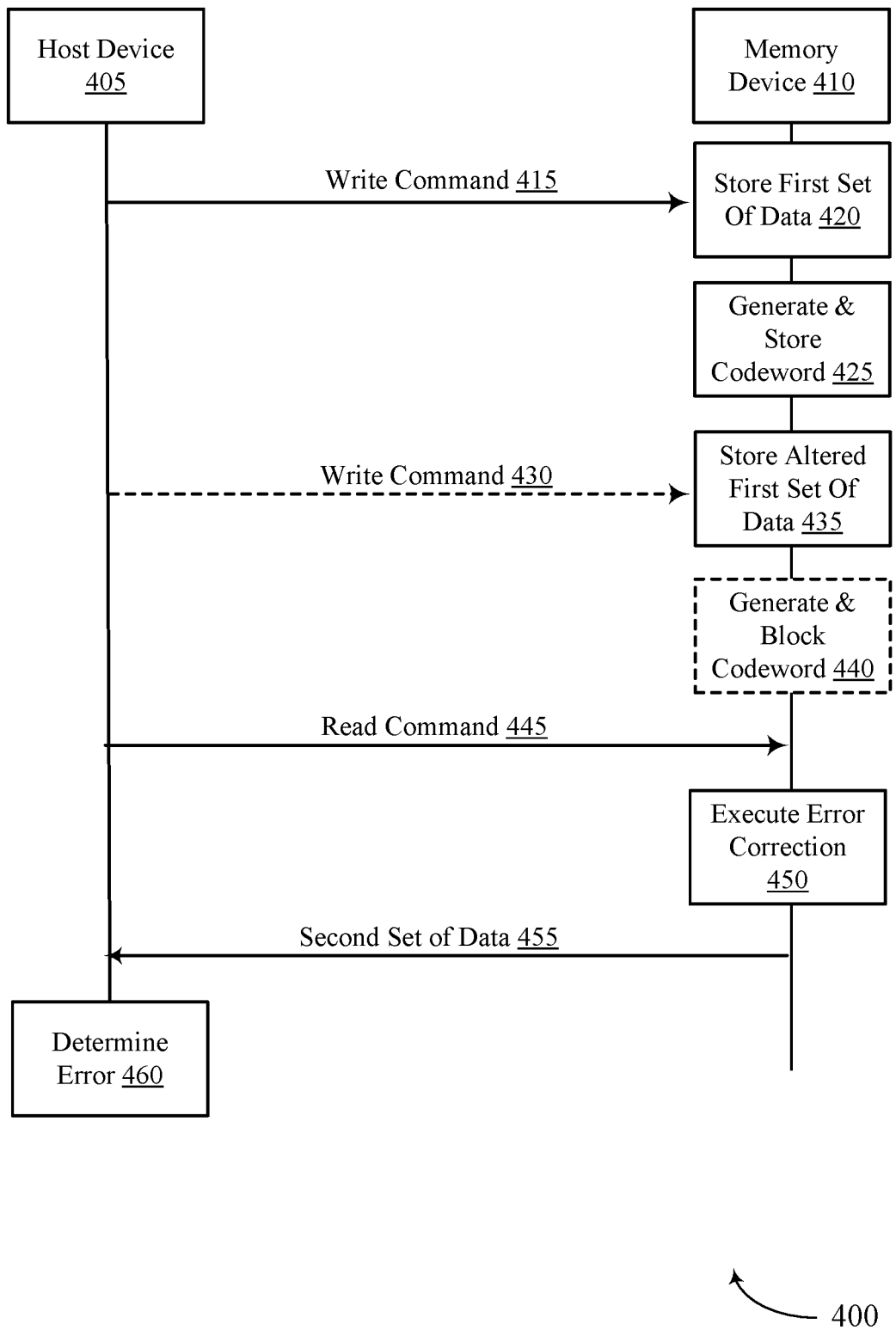
FIGS. 4 through 6 show process flows that support error correction management as disclosed herein.
Figure 5:
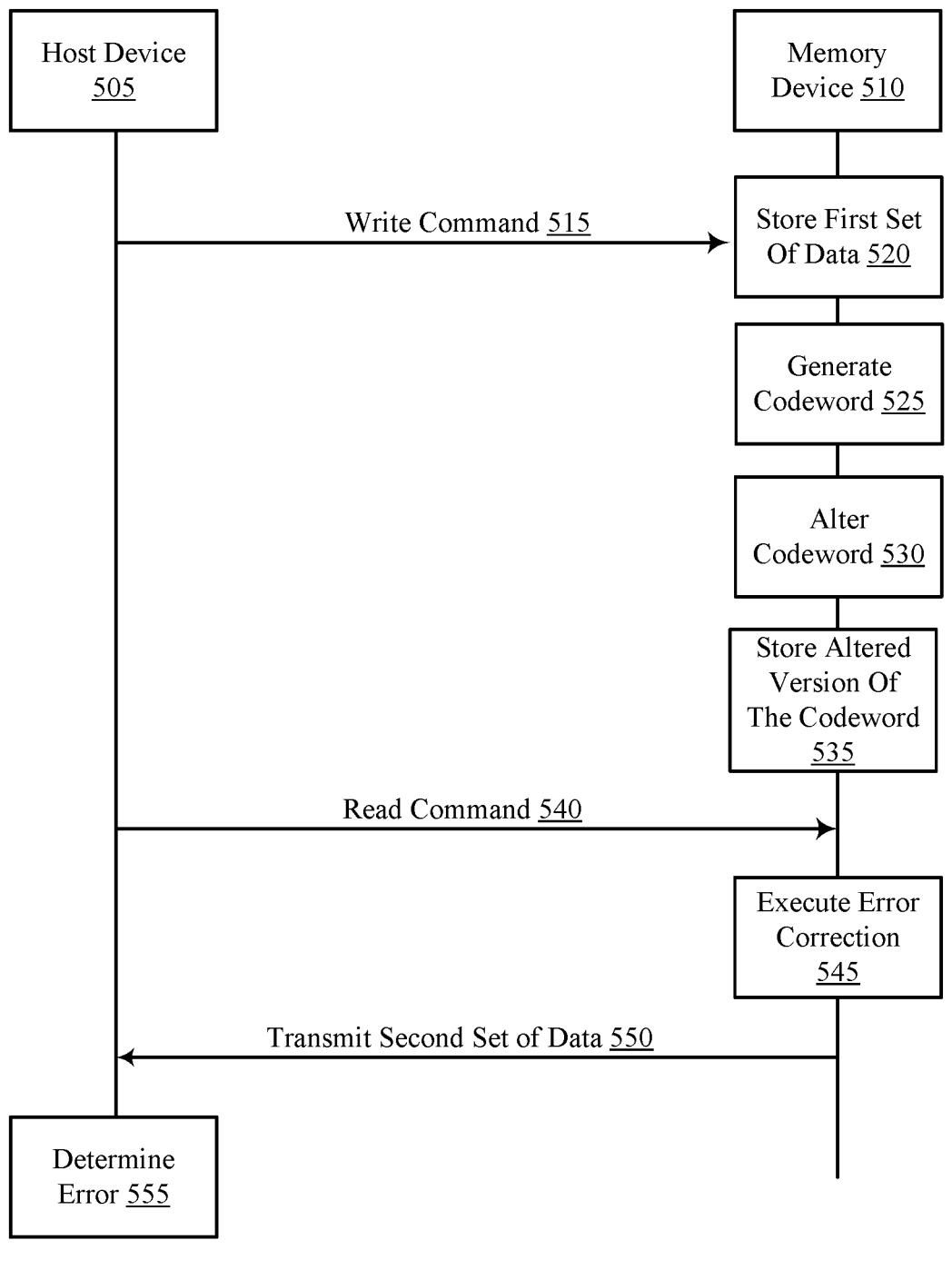
Figure 6:
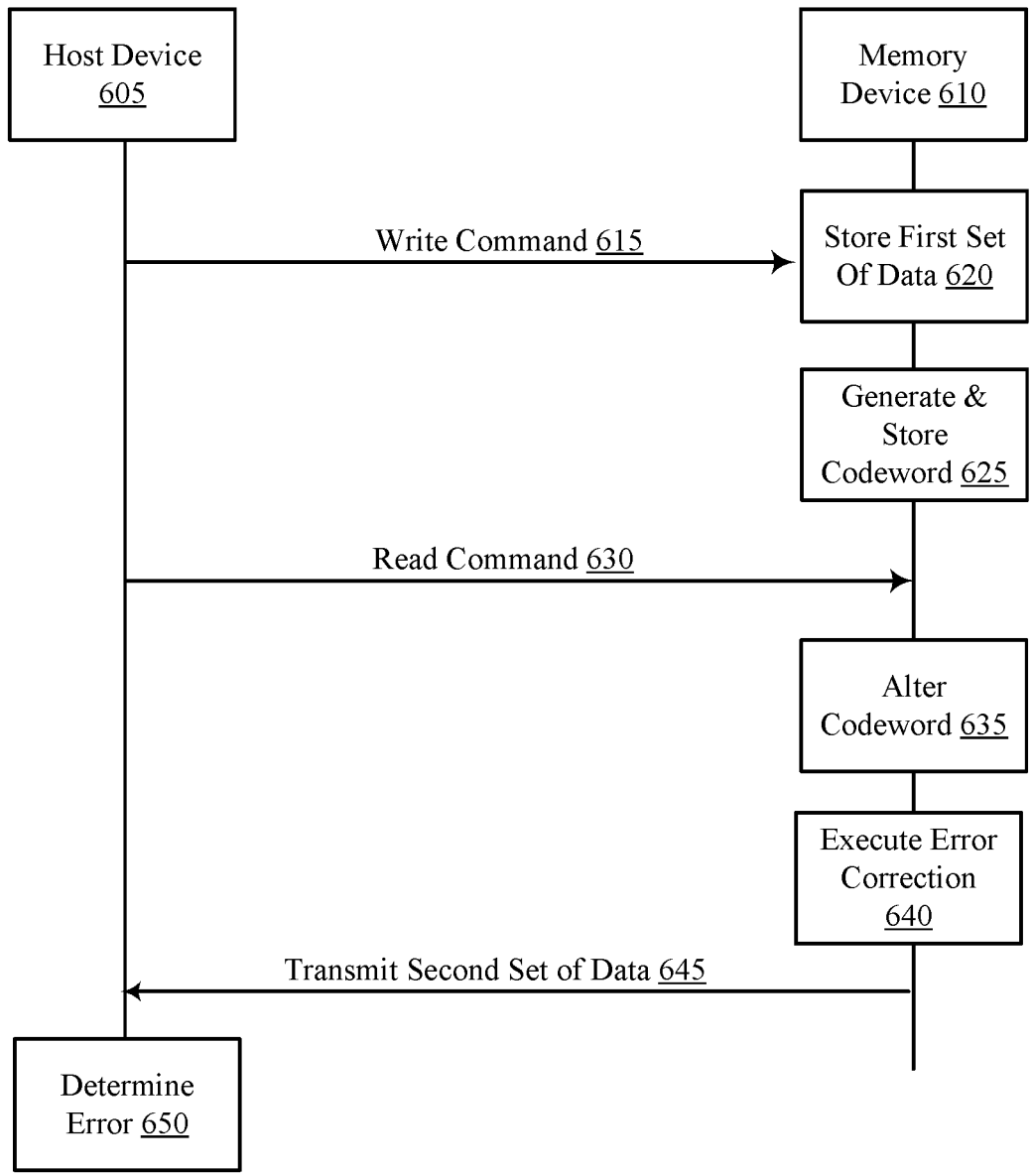

As described herein with reference to FIGS. 4 through 6, an error may be introduced to data stored to one or memory arrays 330-a through 330-n and/or a codeword stored to the ECC sub-array 325. Stated another way, one or more bits of data and/or one or more bits of a codeword may be altered to determine whether the on-die ECC of the memory device 310 is functioning properly. By knowingly altering one or more bits of the data and/or codeword, the host device 305 may determine whether the data it receives from the memory device 310 is consistent with proper operation of the on-die ECC in view of the intentional error.

In some cases, by repeatedly altering one or more bits of data as part of an ECC diagnostic procedure and evaluating data subsequently output by memory device 310, the host device 305 may be able to determine (reverse-engineer) an H-matrix used by the memory device 310. For example, the host device 305 may be able to map double bit fails of the on-die ECC (which in some cases may not be able to detect or correct double bit errors) and thereby determine the H-matrix. Based on determining the H-matrix, the host device 305 may be able to intelligently allocate memory within the memory device 310 to different aspects of data and thereby account for or otherwise mitigate for the impact of one or more shortcomings of the on-die ECC (e.g., the host device 305 may allocate memory within the memory device 310 so as to mitigate the aliasing of third bits).

FIG. 4 illustrates an example of a process flow 400 that supports error correction management as disclosed herein. The process flow 400 may implement aspects of the systems 100 and 300 and memory sub-array 200. The process flow 400 may include operations performed by a host device 405, which may be an example of host device 305 as described with reference to FIG. 3. Host device 405 may implement aspects of the external memory controller 105 as described with reference to FIG. 1. The process flow 400 may further include operations performed by a memory device 410, which may be an example of the memory device 110, the memory array 170, or the memory sub-array 200 as described with reference to FIGS. 1 and 2, and may be examples of the memory device 310, as described with reference to FIG. 3.

The process flow 400 may illustrate a system (e.g., the system 300 as described with reference to FIG. 3) operating in an ECC diagnostic mode or otherwise executing an ECC diagnostic procedure. As described herein, an ECC manager (e.g., an ECC manager 320 as described with reference to FIG. 3) may receive a command from a mode register and/or the host device 405 indicating a mode of operation. In process flow 400, one or more bits of data stored at a memory array (e.g., one of memory arrays 330-a through 330-n as described with reference to FIG. 3) of the memory device 410 may be intentionally altered during an ECC diagnostic procedure.

At 420, the memory device 410 may store a first set of data. In some examples, the first set of data may be stored based on the memory device 410 receiving a write command 415 from the host device 405. The data may be stored at a memory array (e.g., a memory sub-array) dedicated for data storage (e.g., non-codeword storage). For example, the data may be stored at one of memory arrays 330-a through 330-n as described with reference to FIG. 3. As described herein, the memory device 410 may receive the write command 415 via one or more CA channels and the first set of data via one or more DQ channels. The first set of data stored at 420 may correspond to data written to the memory device 410 during an access operation and may serve as a reference when determining whether on-die ECC associated with the memory device 410 is functioning properly.

At 425, the memory device 410 may generate and store a codeword associated with the first set of data (e.g., a first codeword) using an error correction code. As described herein, a codeword may be generated by an ECC component (e.g., ECC component 315 as described with reference to FIG. 3) using a predefined ECC. The first codeword may be stored at a memory array (e.g., a memory sub-array) dedicated for an ECC procedure. For example, the first codeword may be stored at ECC sub-array 325 as described with reference to FIG. 3. The first codeword may be stored to the memory array during a duration that the corresponding data (e.g., the first set of data) remains stored to the memory device 410. In some examples, if the memory device 410 is in a normal mode of operation (e.g., access mode, mission mode), and the first set of data is overwritten (e.g., overwritten by a new set of data), the first codeword stored to the memory array may also be overwritten by a codeword corresponding to the new data. However in some examples as described herein, the first codeword may remain stored to the memory array after the first set of data is overwritten.

At 435, the memory device 410 may store an altered first set of data. The altered first set of data may be stored to a same location as the first set of data. Stated another way, the first set of data stored to the memory device 410 (e.g., at 420) may be overwritten by the altered first set of data. As described herein, an altered first set of data may correspond to the first set of data but for some quantity of bits. For example, the first set of data may include the bits "10101010" whereas the altered first set of data may include the bits "10101011". By altering bits of the first set of data, a known error may be introduced to the data stored at the memory device 410 (e.g., the first set of data). In some examples, the first set of data may be altered based on a write command 430 received from the host device 405 (e.g., the altered first set of data may be generated and provided by the host device 405). However, in some examples, the first set of data may be altered (generated) by one or more components of the memory device 410. Whether the first set of data is altered by the host device 405 or the memory device 410 may be a matter of design choice.

At 440, the memory device 410 may generate a codeword associated with the altered set of data (e.g., a second codeword), but block the second codeword from being stored to the memory device 410. For example, the second codeword may be generated by an ECC component (e.g., an ECC component 315 as described with reference to FIG. 3) using a predefined ECC. However, an ECC manager (e.g., ECC manager 320 as described with reference to FIG. 3) may block the second codeword from being stored to a memory array (e.g., ECC sub-array 325 as described with reference to FIG. 3) of the memory device 410. For example, the ECC manager may discard the second codeword. By blocking the second codeword from being stored to the memory device 410, the first codeword may remain stored to the memory device 410 (e.g., to the ECC sub-array 325 as described with reference to FIG. 3). Thus, the first codeword generated and stored at 425 may correspond to the altered first set of data stored at 435.

In some examples, the operations at 440 may be optional. For example, the ECC component may not generate a second codeword. The memory device 410 (and more particularly, the ECC component) may instead receive one or more signals from a mode register and/or the host device 405 indicating a particular mode of operation. The mode of operation may, for example, prevent the ECC component from generating a second codeword when the memory device 410 receives (or generates) altered data. In another example, the ECC component may generate the second codeword based on the altered first set of data, and may immediately discard it. Stated another way, the ECC component may receive an indication to generate a second codeword associated with the altered first set of data, and may subsequently receive an indication to discard the second codeword (and not store the second codeword to the memory array). In either example—by failing to generate a second codeword associated with the altered set of data or by discarding a second codeword associated with the altered set of data before storing it to a memory array—the altered set of data may remain associated with the first codeword previously generated and stored at 425 based on the unaltered set of data.

In some examples, the memory device 410 may receive a read command 445 from the host device 405. The read command 445 may be associated with the altered first set of data. For example, the read command 445 may request data stored to a same location as the altered first set of data (e.g., the read command 445 may request the altered first set of data). In some examples, upon receiving the read command 445, the memory device 410 may provide the altered first set of data (stored at 435) and the first codeword (generated at 425) to an ECC component.

At 450, an error correction operation may be executed. As described herein, upon receiving the read command 445, the altered first set of data and the first codeword (e.g., the codeword generated and stored at 425) may be provided to an ECC component. The ECC component may generate a codeword (e.g., a third codeword) associated with the altered first set of data and may compare the first and third codewords. Because the first codeword was generated based on the first set of data, and the third codeword was generated based on the altered first set of data, the first and third codewords may differ (exhibit a mismatch) and thereby indicate an error. Stated another way, because the first codeword does not match the third codeword, the memory device 410 may determine that an error exists in the data corresponding to the third codeword (e.g., the altered first set of data).

In some examples, a second set of data 455 may be transmitted to the host device 405 based on the error correction executed at 450. If the ECC component determines the existence of a single bit error at 450, the ECC component may be configured to repair (e.g., fix) the single error associated with the data (e.g., a single bit). Thus, in some cases the error correction operation at 450 may attempt to conform the second set of data to the first set of data stored at 420. Accordingly, if the on-die ECC is operating properly, the second set of data 455 may match the first set of data previously stored to the memory device 410 (e.g., at 420) despite the intentional corruption (alteration) of the first set of data at 435—otherwise, the second set of data 455 may differ from the first set of data previously stored to the memory device 410 (e.g., at 420).

At 460, the host device 405 may determine whether the on-die ECC of the memory device 410 is operating properly based on receiving the second set of data 455. As described herein, a single bit error may be repaired (e.g., fixed) by the ECC component. Thus, based on the ECC component repairing the altered first set of data, the second set of data 455 may be the same as (e.g., identical to) the first set of data. In some examples, this may result in the host device 405 determining that the ECC procedure of the memory device 410 is operating properly. Stated another way, by introducing a single bit error into the altered first set of data, the host device 405 may anticipate receiving second data the same as the first data when the ECC procedure is operating properly. In some examples, however, the second set of data 455 may not match the first set of data. This may be based one or more features of the ECC component functioning improperly (e.g., at 450). Accordingly, when a single bit error was intentionally introduced and the second set of data 455 does not match the first set of data, the host device 405 may determine that the ECC procedure is operating improperly. The host device 405 may then take one or more mitigating actions (e.g., reboot or disable the memory device 410 to rely on a different memory device or some other mitigating action, which may improve the overall reliability of the system (e.g., the system 300 as described with reference to FIG. 3).

In some examples (not shown), the host device 405 may intentionally introduce multiple bit errors into the first set of data. Because the ECC component may be configured to repair a single bit error, introducing a multiple bit error may result in the host device 405 receiving a second set of data 455 that is different than the first set of data or receiving an indication of the multiple bit errors (e.g., an indication of a double bit error) when the ECC component is functioning properly. In other examples, the memory device 410 may intentionally introduce multiple bit errors into the first set of data.

For example, at 435, the memory device 410 may store an altered first set of data having multiple (e.g., two) bits of data altered instead of one. At 450, the ECC component may compare the first codeword with a codeword associated with the first set of altered data (e.g., a fourth codeword). When comparing the first codeword with the fourth codeword, the ECC component may determine that two bits differ. As discussed herein, the error-correcting code may be or may include a SEC code. Accordingly, the ECC component may fail to repair the two bits, and the second set of data 455 transmitted to the host device 405 may differ from the first set of data. However, because the two bits may have been intentionally introduced to the altered first set of altered data, the host device 405 may determine (e.g., at 460) that the ECC component is functioning properly.

Additionally or alternatively, the error-correcting code may be or may include a SECDED code. Accordingly, the ECC may identify the double-bit error and indicate the existence of the double-bit error to the host device 405. Additionally or alternatively, in some cases, the memory device may transmit the second set of data 455 as different than the first set of data. Because the two bits may have been intentionally introduced to the altered first set of altered data, the host device 405 may determine (e.g., at 460) that the ECC component is functioning properly based on receiving the indication of the existence of the double-bit error and/or a second set of data 455 that differs from the first set of data.

It is to be understood that any quantity of errors may be intentionally introduced into the data and that the host device 405 may determine (e.g., at 460) whether the ECC component is functioning properly based on receiving a second set of data 455 or a related indication that is appropriate or inappropriate for the intentionally introduced errors. It is further to be understood that the process flow 400 may be repeated any quantity of times and with different quantities of errors (e.g., first with one intentional error, then again with two intentional errors). It is also to be understood that in some cases the memory device 410 may perform one or more of the functions ascribed to the host device 405 at 460 and may transmit to the host device 405 an indication of whether an error has been determined or either on-die ECC at the memory device 410 has been determined to be operating properly.

FIG. 5 illustrates an example of a process flow 500 that supports error correction management as disclosed herein. The process flow 500 may implement aspects of the systems 100 and 300 and memory sub-array 200. The process flow 500 may include operations performed by a host device 505, which may be an example of host device 305 as described with reference to FIG. 3. Host device 505 may implement aspects of the external memory controller 105 as described with reference to FIG. 1. The process flow 500 may further include operations performed by a memory device 510, which may be an example of the memory device 110, the memory array 170, or the memory sub-array 200 as described with reference to FIGS. 1 and 2, and may be examples of the memory device 310, as described with reference to FIG. 3.

The process flow 500 may illustrate a system (e.g., the system 300 as described with reference to FIG. 3) operating in an ECC diagnostic mode or otherwise executing an ECC diagnostic procedure. As described herein, an ECC manager (e.g., an ECC manager 320 as described with reference to FIG. 3) may receive a command from a mode register and/or the host device 505 indicating a mode of operation. In process flow 500, one or more bits of a codeword (e.g., a first codeword) may be altered before the codeword is stored at a memory array (e.g., memory array 325 as described with reference to FIG. 3) during an ECC diagnostic procedure.

At 520, the memory device 510 may store a first set of data. In some examples, the first set of data may be stored based on the memory device 510 receiving a write command 515 from the host device 505. The data may be stored at a memory array (e.g., a memory sub-array) dedicated for data storage (e.g., non-codeword storage). For example, the data may be stored at one of memory arrays 330-*a* through 330-*n* as described with reference to FIG. 3. As described herein, the memory device 510 may receive the write command 515 via one or more CA channels and the first set of data via one or more DQ channels. The first set of data stored at 520 may correspond to data written to the memory device 510 during an access operation and may facilitate determining whether on-die ECC associated with the memory device 510 is functioning properly.

At 525, the memory device 510 may generate a codeword associated with the first set of data (e.g., a first codeword). As described herein, a codeword may be generated by an ECC component (e.g., ECC component 315 as described with reference to FIG. 3) using a predefined ECC. In some examples, the first codeword may be generated by the ECC component and transmitted to an ECC manager (e.g., ECC manager 320 as described with reference to FIG. 3) for further processing before being stored to a memory array (e.g., ECC sub-array 325 as described with reference to FIG. 3).

At 530, the memory device 510 may alter the first codeword generated at 525 (e.g., resulting in a second codeword). In some examples, the first codeword may be altered by the ECC component and/or the ECC manager as discussed with reference to FIG. 3. For example, the ECC component may generate the first codeword and transmit the first codeword to the ECC manager, and the ECC manager may alter the first codeword. By altering the first codeword (e.g., as opposed to altering the first set of data as described with reference to FIG. 4), altered (e.g., corrupted) data may not be stored to one or more data sub-arrays 330 of the memory device 510.

Upon receiving the first codeword, the ECC manager may alter one or more of the first codeword's bits. In some examples, the second (altered) codeword may be correspond to the first codeword but for some quantity of bits. For example, the first codeword may have been generated based on the first set of data including the bits "10101010". The second codeword, for example, may correspond to data including the bits "10101011". In some examples, this set of data (e.g., the data including the bits "10101011") may or may not be stored to the memory device 510. By altering one bit of the first codeword, a known error may be introduced to the ECC procedure.

At 535, the second codeword may be stored at a memory array (e.g., a memory sub-array) dedicated for an ECC procedure. For example, the second codeword may be stored at ECC sub-array 325 as described with reference to FIG. 3. In some examples, the second codeword may be stored to the memory array during a duration that data corresponding to the first codeword (e.g., the first set of data) remains stored to the memory device 510. The second codeword may overwrite the first codeword generated at 525 and thus may be stored in association with the first set of data stored at 520. Accordingly, during a read operation for the first set of data, the first set of data and the second codeword (rather than the first codeword) may be accessed together.

In some examples, the memory device 510 may receive a read command 540 from the host device 505. The read command 540 may be associated with the first set of data. For example, the read command 540 may request data stored to a same location as the first set of data (e.g., the read command 540 may request the first set of data). In some examples, upon receiving the read command 540, the memory device 510 provide the first set of data (stored at 520) and the second codeword (stored at 535) to an ECC component.

At 545, an error correction operation may be executed. As described herein, upon receiving the read command 540, the first set of data and the second codeword (e.g., the altered codeword stored at 535) may be provided to an ECC component. The ECC component may generate a codeword (e.g., a third codeword) associated with the first set of data and may compare the second and third codewords. Because the third codeword was generated based on the first set of data, and the second codeword was intentionally altered relative to the first codeword originally generated based on the first set of data, the second and third codewords may differ (exhibit a mismatch) and therefore indicate an error. Stated another way, because the second codeword does not match the third codeword, the memory device 510 may determine that an error exists in the data corresponding to the second codeword (that is, an error exists in the first set of data stored at 520).

In some examples, a second set of data 550 may be transmitted to the host device 505 based on the error correction executed at 545. If the ECC component determines the existence of a single bit error at 545, the ECC component may be configured to repair (e.g., fix) the single error associated with the data (e.g., a single bit). Thus, in some cases the error correction operation at 545 may attempt to conform the second set of data to the codeword that would give rise to the second codeword (that is, for the operative ECC, the altered codeword stored at 535 would be the correct codeword for some set of seed data other than the first set of data stored at 520, and the correction operation at 545 therefore may attempt to conform the second set of data to that other set of seed data). Accordingly, if the on-die ECC is operating properly, the second set of data 550 may differ from the first set of data previously stored to the memory device 510 (e.g., at 520) and may instead match the data (seed data) corresponding to the altered codeword stored at 535—otherwise, the second set of data 550 may differ from the data (seed data) corresponding to the altered codeword stored at 535.

At 555, the host device 505 may determine whether the on-die ECC of the memory device 510 is operating properly based on receiving the second set of data 550. As described herein, a single bit error may be repaired (e.g., fixed) by the ECC component. Thus, based on the ECC component repairing the data associated with the second codeword (e.g., the altered codeword), the second set of data 550 may differ from the first set of data and instead be the same as (be identical to) the data (seed data) corresponding to the altered codeword stored at 535. In some examples, this may result in the host device 505 determining that the ECC procedure of the memory device 510 is operating properly. Stated another way, by introducing a single bit error into the codeword generated based on the first set of data (e.g., the first codeword), the host device 505 may anticipate receiving second data that differs from the first data when the ECC procedure is operating properly. In some examples, however, the second set of data 550 may match the first set of data. This may be based one or more features of the ECC component functioning improperly (e.g., at 545). Accordingly, in some cases, when a single bit error was intentionally introduced and the second set of data 550 matches the first set of data, the host device 505 may determine that the ECC procedure is operating improperly. The host device 505 may then take one or more mitigating actions (e.g., reboot or disable the memory device 510 to rely on a different memory device or some other mitigating action, which may improve the overall reliability of the system (e.g., the system 300 as described with reference to FIG. 3).

In some examples (not shown), the memory device 510 may intentionally introduce multiple bit errors into the first codeword. Because the ECC component may be configured to repair a single bit error, introducing a multiple bit error may result in the host device 505 receiving a second set of data 550 that is different than the data (seed data) corresponding to the altered codeword stored at 535 or receiving an indication of the multiple bit errors (e.g., an indication of a double bit error) when the ECC component is functioning properly.

For example, at 530, the memory device 510 may alter multiple (e.g., two) bits of the first codeword and may subsequently store the codeword (e.g., a fourth codeword) to a memory array of the memory device 510. At 545, the ECC component may compare the third codeword with the fourth codeword. When comparing the third codeword with the fourth codeword, the ECC component may determine that two bits of the data associated with the respective codewords differ. As discussed herein, the error-correcting code may be or may include a SEC code. Accordingly, the ECC component may fail to repair the two bits, and the second set of data 550 transmitted to the host device 505 may differ from the first set of data. However, because the two bits may have been intentionally introduced to the first codeword, the host device 505 may determine (e.g., at 555) that the ECC component is functioning properly.

Additionally or alternatively, the error-correcting code may be or may include a SECDED code. Accordingly, the ECC may identify the double-bit error and indicate the existence of the double-bit error to the host device 505. Additionally or alternatively, in some cases, the memory device may transmit the second set of data 550 as different than the first set of data. Because the double bit error may have been intentionally introduced via modification of the codeword stored at 535, the host device 505 may determine (e.g., at 555) that the ECC component is functioning properly based on receiving the indication of the existence of the double-bit error and/or a second set of data 550 that differs from the first set of data stored at 520.

In some cases, rather than generating the first codeword at 525 and then altering the codeword at 530, the memory device 510 (e.g., the ECC component or the ECC manager) may alter the first set of data stored at 520 as it is provided to the ECC component, such that the ECC component generates the first codeword based on the altered set of first data. In such cases, the altered set of first data provided to the ECC component may substitute for the data (seed data) corresponding to the altered codeword described herein as being stored at 535, and the first codeword based on the altered set of first data may substitute for the altered codeword described herein as being stored at 535.

It is to be understood that any quantity of errors may be intentionally introduced into the codeword generated at 525 and that the host device 505 may determine (e.g., at 555) whether the ECC component is functioning properly based on receiving a second set of data 550 or a related indication that is appropriate or inappropriate for the intentionally introduced errors. It is further to be understood that the process flow 500 may be repeated any quantity of times and with different quantities of errors (e.g., first with one intentional error, then again with two intentional errors). It is also to be understood that in some cases the memory device 510 may perform one or more of the functions ascribed to the host device 505 at 555 and may transmit to the host device 505 an indication of whether an error has been determined or either on-die ECC at the memory device 510 has been determined to be operating properly.

FIG. 6 illustrates an example of a process flow 600 that supports error correction management as disclosed herein. The process flow 600 may implement aspects of the systems 100 and 300 and memory sub-array 200. The process flow 600 may include operations performed by a host device 605, which may be an example of host device 305 as described with reference to FIG. 3. Host device 605 may implement aspects of the external memory controller 105 as described with reference to FIG. 1. The process flow 600 may further include operations performed by a memory device 610, which may be an example of the memory device 110, the memory array 170, or the memory sub-array 200 as described with reference to FIGS. 1 and 2, and may be examples of the memory device 310, as described with reference to FIG. 3.

The process flow 600 may illustrate a system (e.g., the system 300 as described with reference to FIG. 3) operating in an ECC diagnostic mode or otherwise executing an ECC diagnostic procedure. As described herein, an ECC manager (e.g., an ECC manager 320 as described with reference to FIG. 3) may receive a command from a mode register and/or the host device 605 indicating a mode of operation. In process flow 600, one or more bits of a codeword (e.g., a first codeword) may be altered after being stored at a memory array (e.g., ECC sub-array 325 as described with reference to FIG. 3) during an ECC diagnostic procedure.

At 620, the memory device 610 may store a first set of data. In some examples, the first set of data may be stored based on the memory device 610 receiving a write command 615 from the host device 605. The data may be stored at a memory array (e.g., a memory sub-array) dedicated for data storage (e.g., non-codeword storage). For example, the data may be stored at one of memory arrays 330-*a* through 330-*n* as described with reference to FIG. 3. As described herein, the memory device 610 may receive the write command 615 via one or more CA channels and the first set of data via one or more DQ channels. The first set of data stored at 620 may correspond to data written to the memory device 610 during an access operation and may facilitate determining whether on-die ECC associated with the memory device 610 is functioning properly.

At 625, the memory device 610 may generate and store a codeword associated with the first set of data (e.g., a first codeword). As described herein, a codeword may be generated by an ECC component (e.g., ECC component 315 as described with reference to FIG. 3) using a predefined error correction code. The first codeword may be stored at a memory array (e.g., a memory sub-array) dedicated for an ECC procedure. For example, the first codeword may be stored at ECC sub-array 325 as described with reference to FIG. 3. The first codeword may be stored to the memory array during a duration that the corresponding data (e.g., the first set of data) remains stored to the memory device 610.

In some examples, the memory device 610 may receive a read command 630 from the host device 605. The read command 630 may be associated with the first set of data. For example, the read command 630 may request data stored to a same location as the first set of data (e.g., the read command 630 may request the first set of data). In some examples, upon receiving the read command 630, the memory device 610 provide the first set of data (stored at 620) and the first codeword (stored at 625) to an ECC component.

At 635, the memory device 610 may alter the first codeword generated at 625 (e.g., resulting in a second codeword). In some examples, the first codeword may be altered by the ECC component and/or the ECC manager as discussed with reference to FIG. 3. For example, the ECC component may receive the first codeword (e.g., based on a read command 630) and may transmit the first codeword to the ECC manager. The ECC manager may then alter the first codeword before providing the second codeword to the ECC component. By altering the first codeword after storing it to the memory array, neither altered (e.g., corrupted) data nor an altered codeword may be stored to one or more memory arrays of the memory device 610.

In some examples, the memory device 610 may alter one or more of the first codeword's bits. In some examples, the second codeword (altered) may be correspond to the first codeword but for some quantity of bits. For example, the first codeword may have been generated based on the first set of data including the bits "10101010". The second codeword, for example, may correspond to data including the bits "10101011". In some examples, this set of data (e.g., the data including the bits "10101011") may or may not be stored to the memory device 610. By altering one bit of the first codeword, a known error may be introduced to the ECC procedure.

At 640, an error correction operation may be executed. As described herein, upon receiving the read command 630, the first set of data and the first codeword may be provided to an ECC component. The ECC component may, in turn, transmit the first codeword to the ECC manager, which may alter one bit of the first codeword. The resulting second codeword may be transmitted back to the ECC component. Based on receiving the first data, the ECC component may generate a codeword (e.g., a third codeword) associated with the first set of data and may compare the second and third codewords. Because the third codeword was generated based on the first set of data, and the second codeword was intentionally altered relative to the first codeword originally generated based on the first set of data, the second and third codewords may differ (exhibit a mismatch) and therefore indicate an error. Stated another way, because the second codeword does not match the third codeword, the memory device 610 may determine that an error exists in the data corresponding to the second codeword (that is, an error exists in the first set of data stored at 620).

In some examples, a second set of data 645 may be transmitted to the host device 605 based on the error correction executed at 640. If the ECC component determines the existence of a single bit error at 640, the ECC component may be configured to repair (e.g., fix) the single error associated with the data (e.g., a single bit). Thus, in some cases the error correction operation at 640 may attempt to conform the second set of data to the codeword that would give rise to the second codeword (that is, for the operative ECC, the altered codeword generated at 635 would be the correct codeword for some set of seed data other than the first set of data stored at 620, and the correction operation at 640 therefore may attempt to conform the second set of data 645 to that other set of seed data). Accordingly, if the on-die ECC is operating properly, the second set of data 645 may differ from the first set of data previously stored to the memory device 610 (e.g., at 620) and may instead match the data (seed data) corresponding to the altered codeword generated at 635—otherwise, the second set of data 645 may differ from the data (seed data) corresponding to the altered codeword generated at 635.

At 650, the host device 605 may determine whether the on-die ECC of the memory device 610 is operating properly based on receiving the second set of data 645. As described herein, a single bit error may be repaired (e.g., fixed) by the ECC component. Thus, based on the ECC component repairing the data associated with the second codeword (e.g., the altered codeword), the second set of data 645 may differ from the first set of data and instead be the same as (be identical to) the data (seed data) corresponding to the altered codeword generated at 635. In some examples, this may result in the host device 605 determining that the ECC procedure of the memory device 610 is operating properly. Stated another way, by introducing a single bit error into the codeword generated at 635, the host device 505 may anticipate receiving the second set of data 645 that differs from the first data when the ECC procedure is operating properly. In some examples, however, the second set of data 645 may match the first set of data. This may be based one or more features of the ECC component functioning improperly (e.g., at 640). Accordingly, in some cases, when a single bit error was intentionally introduced and the second set of data 645 matches the first set of data, the host device 605 may determine that the ECC procedure is operating improperly. The host device 605 may then take one or more mitigating actions (e.g., reboot or disable the memory device 610 to rely on a different memory device or some other mitigating action, which may improve the overall reliability of the system (e.g., the system 300 as described with reference to FIG. 3).

In some examples (not shown), the memory device 610 may intentionally introduce multiple bit errors into the first codeword. Because the ECC component may be configured to repair a single bit error, introducing a multiple bit error may result in the host device 605 receiving a second set of data 645 that is different than the data (seed data) corresponding to the altered codeword generated at 635 or receiving an indication of the multiple bit errors (e.g., an indication of a double bit error) when the ECC component is functioning properly.

For example, at 635, the memory device 610 may alter multiple (e.g., two) bits of the first codeword after a read command 630. The resulting codeword (e.g., a fourth codeword) to may be compared with the third codeword (e.g., by the ECC component). When comparing the third codeword with the fourth codeword, the ECC component may determine that two bits of the data associated with the respective codewords differ. As discussed herein, the error-correcting code may be or may include a SEC code. Accordingly, the ECC component may be configured fail to repair the two bits, and the second set of data 645 transmitted to the host device 605 may differ from the first set of data. However, because the two bits may have been intentionally introduced to the first codeword, the host device 605 may determine (e.g., at 650) that the ECC component is functioning properly.

Additionally or alternatively, the error-correcting code may be or may include a SECDED code. Accordingly, the ECC may identify the double-bit error and indicate the existence of the double-bit error to the host device 605. Additionally or alternatively, in some cases, the memory device may transmit the second set of data 645 as different than the first set of data. Because the double bit error may have been intentionally introduced via modification of the codeword generated at 635, the host device 605 may determine (e.g., at 650) that the ECC component is functioning properly based on receiving the indication of the existence of the double-bit error and/or a second set of data 645 that differs from the first set of data stored at 620.

It is to be understood that any quantity of errors may be intentionally introduced into the codeword generated at 635 and that the host device 605 may determine (e.g., at 650) whether the ECC component is functioning properly based on receiving a second set of data 645 or a related indication that is appropriate or inappropriate for the intentionally introduced errors. It is further to be understood that the process flow 600 may be repeated any quantity of times and with different quantities of errors (e.g., first with one intentional error, then again with two intentional errors). It is also to be understood that in some cases the memory device 610 may perform one or more of the functions ascribed to the host device 605 at 650 and may transmit to the host device 605 an indication of whether an error has been determined or either on-die ECC at the memory device 610 has been determined to be operating properly.

Figure 7:
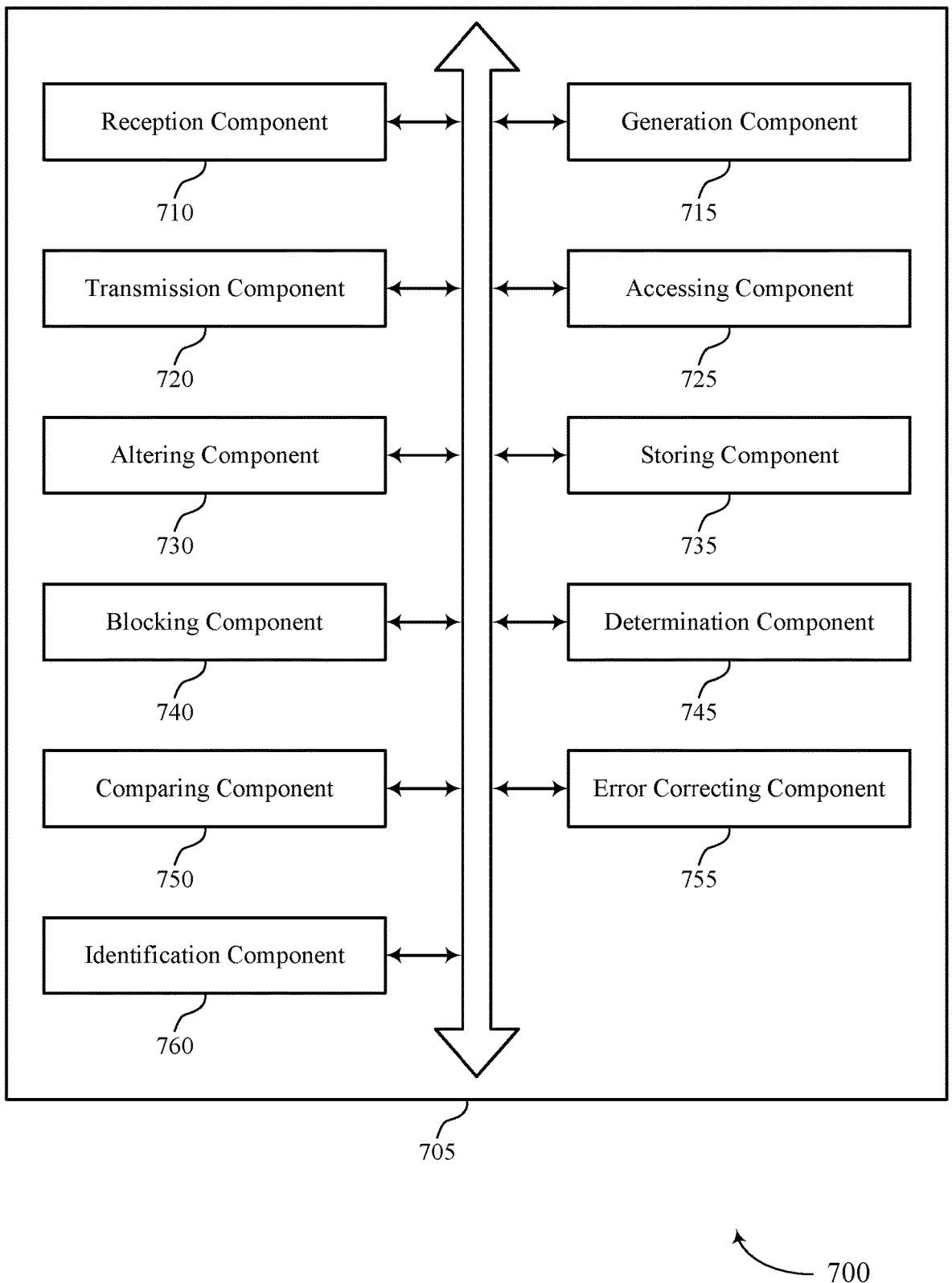
FIG. 7 illustrates a block diagram of a memory device that supports error correction management as disclosed herein.

FIG. 7 shows a block diagram 700 of a memory device 705 that supports error correction management as disclosed herein. The memory device 705 may be an example of aspects of a device as described with reference to FIGS. 3 through 6. The memory device 705 may include a reception component 710, a generation component 715, a transmission component 720, an accessing component 725, an altering component 730, a storing component 735, a blocking component 740, a determination component 745, a comparing component 750, an error correcting component 755, and an identification component 760. Each of these modules may communicate, directly or indirectly, with one another (e.g., via one or more buses).

The reception component 710 may receive, from a host device, a write command for a first set of data. In some examples, the reception component 710 may receive, from the host device, a read command for the first set of data. In some examples, the reception component 710 may receive, from the host device, the altered version of the first set of data. In some examples, the reception component 710 may receive, from the host device, a second write command for the altered version of the first set of data. In some examples, the reception component 710 may receive, from the host device, a command to switch from a first mode of operation to a second mode of operation, where identifying the altered version of the first set of data or the altered version of the codeword is based on being in the second mode of operation.

The generation component 715 may generate, based on the write command, a codeword that corresponds to the first set of data. In some examples, the generation component 715 may generate the altered version of the codeword based on the write command. In some examples, the generation component 715 may generate the altered version of the first set of data or the altered version of the codeword, where transmitting the second set of data is based on generating the altered version of the first set of data or the altered version of the codeword. In some examples, the generation component 715 may generate, based on the second write command, a second codeword that corresponds to the altered version of the first set of data.

In some examples, the generation component 715 may generate, based on the read command, a third codeword that corresponds to the altered version of the first set of data. In some examples, the generation component 715 may generate the second set of data based on comparing the codeword with the third codeword. In some examples, the generation component 715 may generate, based on accessing the altered version of the first set of data, the third codeword.

The transmission component 720 may transmit, to the host device, a second set of data that is based on an altered version of the first set of data or an altered version of the codeword. In some examples, the transmission component 720 may transmit one or more commands to the host device based on attempting to generate the second set of data as identical to the first set of data.

The accessing component 725 may access the codeword based on the read command. In some examples, the accessing component 725 may access the altered version of the codeword based on the read command. In some examples, the accessing component 725 may access, based on the read command, the altered version of the first set of data.

The altering component 730 may alter, based on accessing the codeword, at least one bit of the codeword to generate the altered version of the codeword. In some examples, the altering component 730 may alter, based on the write command, at least one bit in the first set of data to generate the altered version of the first set of data.

The storing component 735 may store the codeword based on the write command. In some examples, the storing component 735 may store the altered version of the codeword. In some examples, the storing component 735 may store, based on the write command, the first set of data at a first location within a memory device. In some examples, the storing component 735 may store, based on the second write command, the altered version of the first set of data at the first location within the memory device, where storing the altered version of the first set of data overwrites at least some of the first set of data.

In some examples, the storing component 735 may store, based on the write command, the codeword at a second location within the memory device. In some examples, the storing component 735 may store, based on the write command, the codeword at a second location within a memory device.

The blocking component 740 may block the second location within the memory device from being accessed based on the second write command and storing the codeword at the second location. In some examples, the blocking component 740 may discard, based on determining the mode of operation of the memory device, the second codeword.

The determination component 745 may determine a mode of operation of the memory device.

The comparing component 750 may compare, based on the read command, the codeword with the third codeword.

The error correcting component 755 may attempt to generate the second set of data as identical to the first set of data based on the altered version of the first set of data or the altered version of the codeword.

The identification component 760 may identify the altered version of the first set of data or the altered version of the codeword.

Figure 8:
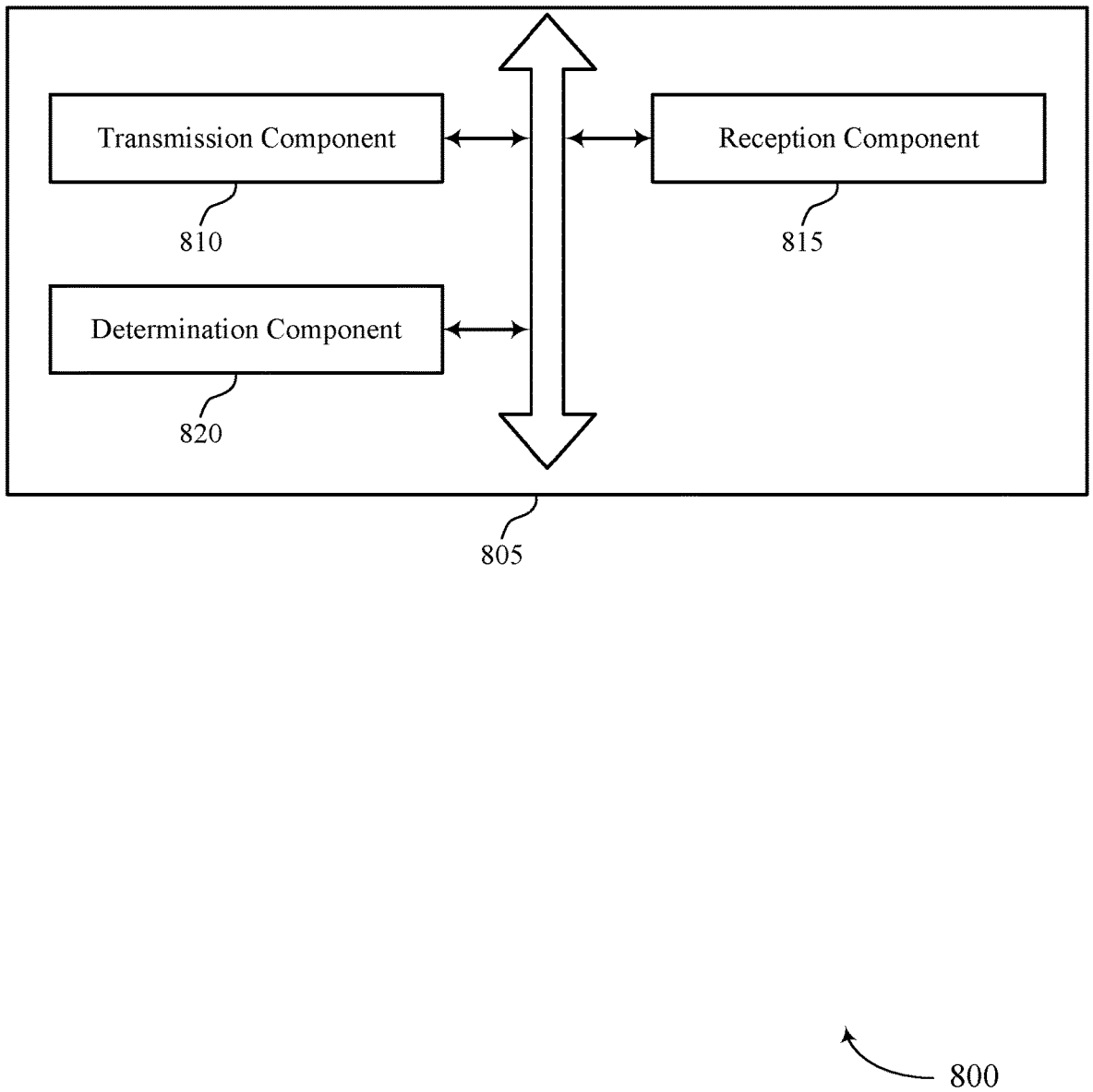
FIG. 8 illustrates a block diagram of a host device that supports error correction management as disclosed herein.

FIG. 8 shows a block diagram 800 of a host device 805 that supports error correction management as disclosed herein. The host device 805 may be an example of aspects of a device as described with reference to FIGS. 3 through 6. The host device 805 may include a transmission component 810, a reception component 815, and a determination component 820. Each of these modules may communicate, directly or indirectly, with one another (e.g., via one or more buses).

The transmission component 810 may transmit, to a memory device, a write command for a first set of data. In some examples, the transmission component 810 may transmit, to the memory device based on transmitting the write command, a read command for the first set of data. In some examples, the transmission component 810 may transmit one or more commands to the memory device based on determining that the memory device has committed the error. In some examples, the transmission component 810 may transmit one or more commands to the memory device based on determining that the memory device has committed the error.

In some examples, the transmission component 810 may transmit, to the memory device, a second write command that indicates the altered version of the first set of data, where transmitting the read command occurs after transmitting the second write command. In some examples, the transmission component 810 may transmit, to the memory device, a command to enter a mode of operation for testing error correcting functionality, where receiving the second set of data is based at least in part the mode of operation.

The reception component 815 may receive, from the memory device based on transmitting the read command, a second set of data that is based on an altered version of the first set of data or an altered version of a codeword that corresponds to the first set of data.

The determination component 820 may determine that the second set of data is different than the first set of data. In some examples, the determination component 820 may determine that the memory device has committed an error based on the second set of data being different than the first set of data. In some examples, the determination component 820 may determine that the second set of data is identical to the first set of data. In some examples, the determination component 820 may determine that the memory device has committed an error based on the second set of data being identical to the first set of data.

Figure 9:
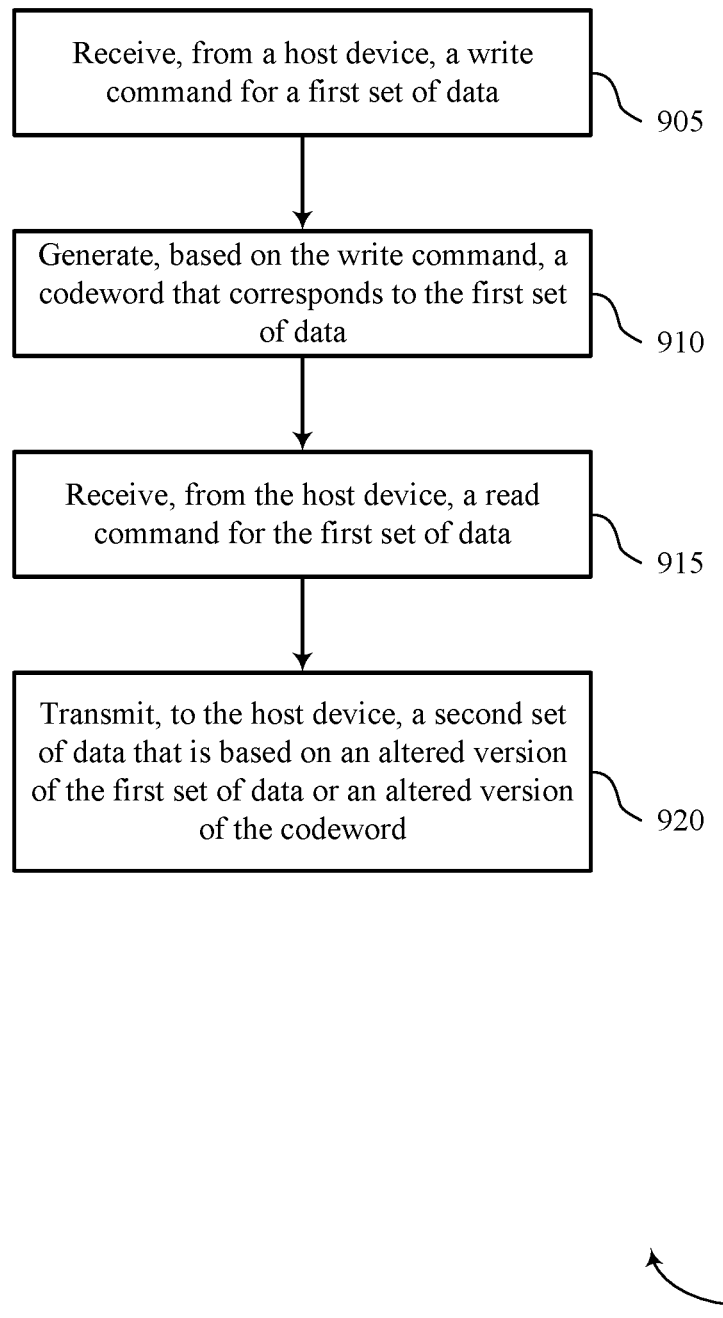
FIGS. 9 through 15 show flowcharts illustrating a method or methods that support error correction management as disclosed herein.

FIG. 9 shows a flowchart illustrating a method 900 that supports error correction management as disclosed herein. The operations of method 900 may be implemented by a memory device or its components as described herein. For example, the operations of method 900 may be performed by a memory device as described with reference to FIG. 7. In some examples, a memory controller may execute a set of instructions to control the functional elements of the memory device to perform the described functions. Additionally or alternatively, a memory device may perform aspects of the described functions using special-purpose hardware.

At 905, the memory device may receive, from a host device, a write command for a first set of data. The operations of 905 may be performed according to the methods described herein. In some examples, aspects of the operations of 905 may be performed by a reception component as described with reference to FIG. 7.

At 910, the memory device may generate, based on the write command, a codeword that corresponds to the first set of data. The operations of 910 may be performed according to the methods described herein. In some examples, aspects of the operations of 910 may be performed by a generation component as described with reference to FIG. 7.

At 915, the memory device may receive, from the host device, a read command for the first set of data. The operations of 915 may be performed according to the methods described herein. In some examples, aspects of the operations of 915 may be performed by a reception component as described with reference to FIG. 7.

At 920, the memory device may transmit, to the host device, a second set of data that is based on an altered version of the first set of data or an altered version of the codeword. The operations of 920 may be performed according to the methods described herein. In some examples, aspects of the operations of 920 may be performed by a transmission component as described with reference to FIG. 7.

In some examples, an apparatus as described herein may perform a method or methods, such as method 900. The apparatus may include features, means, or instructions (e.g., a non-transitory computer-readable medium storing instructions executable by a processor) for receiving, from a host device, a write command for a first set of data, generating, based at least in part on the write command, a codeword that corresponds to the first set of data, receiving, from the host device, a read command for the first set of data, and transmitting, to the host device, a second set of data that is based at least in part on an altered version of the first set of data or an altered version of the codeword.

Some examples of the methods, apparatuses, and non-transitory computer-readable medium described herein may further include operations, features, means, or instructions for storing the codeword based at least in part on the write command, accessing the codeword based at least in part on the read command, and altering, based at least in part on accessing the codeword, at least one bit of the codeword to generate the altered version of the codeword.

Some examples of the methods, apparatuses, and non-transitory computer-readable medium described herein may further include operations, features, means, or instructions for storing the codeword based at least in part on the write command, accessing the codeword based at least in part on the read command, and altering, based at least in part on accessing the codeword, at least one bit of the codeword to generate the altered version of the codeword.

Some examples of the methods, apparatuses, and non-transitory computer-readable medium described herein may further include operations, features, means, or instructions for generating the altered version of the codeword based at least in part on the write command, storing the altered version of the codeword, and accessing the altered version of the codeword based at least in part on the read command.

Some examples of the methods, apparatuses, and non-transitory computer-readable medium described herein may further include operations, features, means, or instructions for receiving, from the host device, the altered version of the first set of data.

Some examples of the methods, apparatuses, and non-transitory computer-readable medium described herein may further include operations, features, means, or instructions for generating the altered version of the first set of data or the altered version of the codeword, wherein transmitting the second set of data is based at least in part on generating the altered version of the first set of data or the altered version of the codeword.

Some examples of the methods, apparatuses, and non-transitory computer-readable medium described herein may further include operations, features, means, or instructions for storing, based at least in part on the write command, the first set of data at a first location within a memory device, receiving, from the host device, a second write command for the altered version of the first set of data, and storing, based at least in part on the second write command, the altered version of the first set of data at the first location within the memory device, wherein storing the altered version of the first set of data overwrites at least some of the first set of data.

Some examples of the methods, apparatuses, and non-transitory computer-readable medium described herein may further include operations, features, means, or instructions for storing, based at least in part on the write command, the codeword at a second location within the memory device and blocking the second location within the memory device from being accessed based at least in part on the second write command and storing the codeword at the second location.

Some examples of the methods, apparatuses, and non-transitory computer-readable medium described herein may further include operations, features, means, or instructions for generating, based at least in part on the second write command, a second codeword that corresponds to the altered version of the first set of data, determining a mode of operation of the memory device, and discarding, based at least in part on determining the mode of operation of the memory device, the second codeword.

Some examples of the methods, apparatuses, and non-transitory computer-readable medium described herein may further include operations, features, means, or instructions for storing, based at least in part on the write command, the codeword at a second location within a memory device, generating, based at least in part on the read command, a third codeword that corresponds to the altered version of the first set of data, comparing, based at least in part on the read command, the codeword with the third codeword, and generating the second set of data based at least in part on comparing the codeword with the third codeword.

Some examples of the methods, apparatuses, and non-transitory computer-readable medium described herein may further include operations, features, means, or instructions for accessing, based at least in part on the read command, the altered version of the first set of data and generating, based at least in part on accessing the altered version of the first set of data, the third codeword.

Some examples of the methods, apparatuses, and non-transitory computer-readable medium described herein may further include operations, features, means, or instructions for altering, based at least in part on the write command, at least one bit in the first set of data to generate the altered version of the first set of data.

In some examples of the methods, apparatuses, and non-transitory computer-readable medium described herein, at least two bits in the altered version of the first set of data differ from corresponding bits in the first set of data.

In some examples of the methods, apparatuses, and non-transitory computer-readable readable medium described herein, at least two bits in the altered version of the codeword have different values than corresponding bits in the codeword.

Some examples of the methods, apparatuses, and non-transitory computer-readable medium described herein may further include operations, features, means, or instructions for attempting to generate the second set of data as identical to the first set of data based at least in part on the altered version of the first set of data or the altered version of the codeword and transmitting one or more commands to the host device based at least in part on attempting to generate the second set of data as identical to the first set of data.

Some examples of the methods, apparatuses, and non-transitory computer-readable medium described herein may further include operations, features, means, or instructions for identifying the altered version of the first set of data or the altered version of the codeword.

Some examples of the methods, apparatuses, and non-transitory computer-readable medium described herein may further include operations, features, means, or instructions for receiving, from the host device, a command to switch from a first mode of operation to a second mode of operation, wherein identifying the altered version of the first set of data or the altered version of the codeword is based at least in part on being in the second mode of operation.

Figure 10:
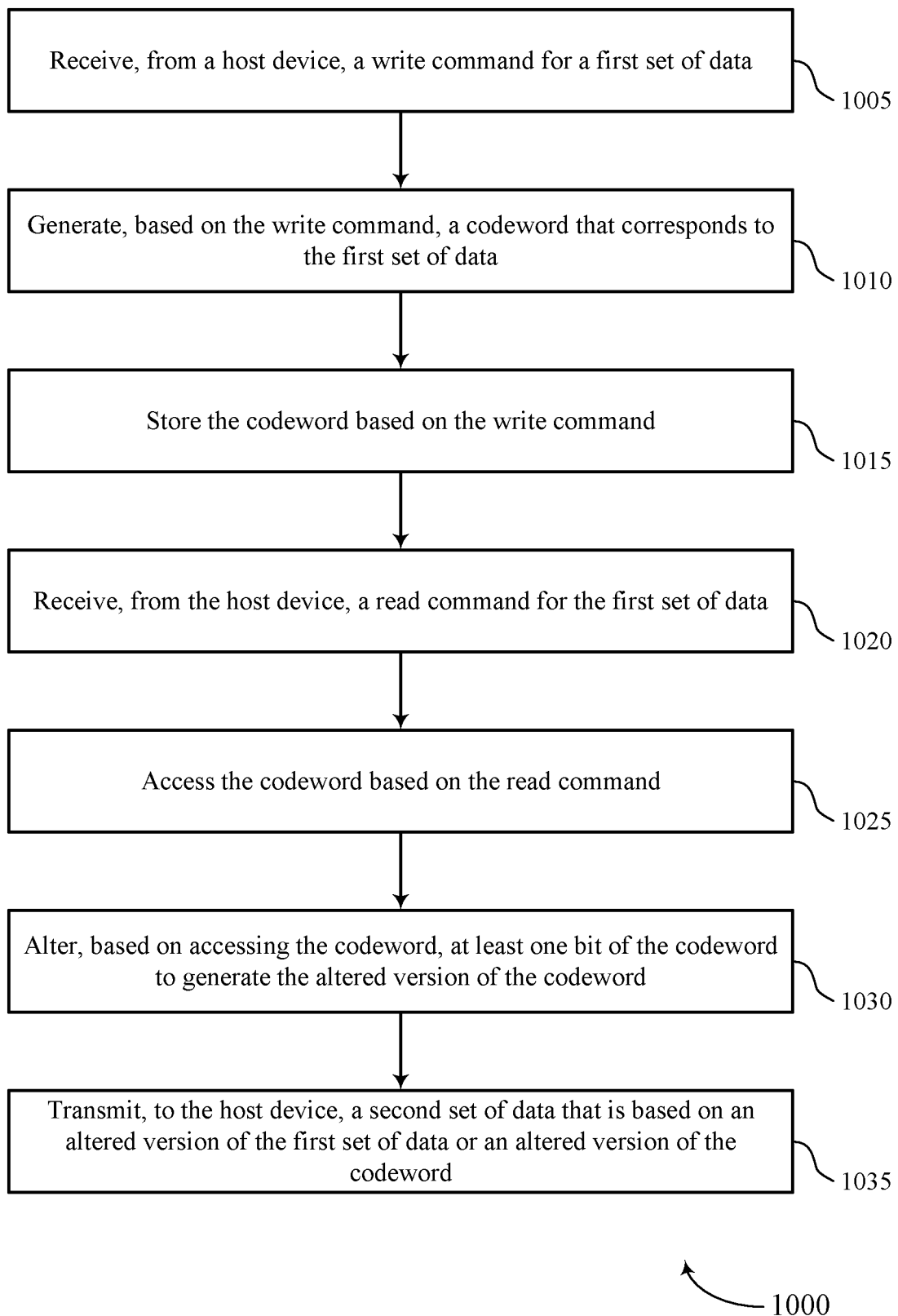

FIG. 10 shows a flowchart illustrating a method 1000 that supports error correction management as disclosed herein. The operations of method 1000 may be implemented by a memory device or its components as described herein. For example, the operations of method 1000 may be performed by a memory device as described with reference to FIG. 7. In some examples, a memory controller may execute a set of instructions to control the functional elements of the memory device to perform the described functions. Additionally or alternatively, a memory device may perform aspects of the described functions using special-purpose hardware.

At 1005, the memory device may receive, from a host device, a write command for a first set of data. The operations of 1005 may be performed according to the methods described herein. In some examples, aspects of the operations of 1005 may be performed by a reception component as described with reference to FIG. 7.

At 1010, the memory device may generate, based on the write command, a codeword that corresponds to the first set of data. The operations of 1010 may be performed according to the methods described herein. In some examples, aspects of the operations of 1010 may be performed by a generation component as described with reference to FIG. 7.

At 1015, the memory device may store the codeword based on the write command. The operations of 1015 may be performed according to the methods described herein. In some examples, aspects of the operations of 1015 may be performed by a storing component as described with reference to FIG. 7.

At 1020, the memory device may receive, from the host device, a read command for the first set of data. The operations of 1020 may be performed according to the methods described herein. In some examples, aspects of the operations of 1020 may be performed by a reception component as described with reference to FIG. 7.

At 1025, the memory device may access the codeword based on the read command. The operations of 1025 may be performed according to the methods described herein. In some examples, aspects of the operations of 1025 may be performed by an accessing component as described with reference to FIG. 7.

At 1030, the memory device may alter, based on accessing the codeword, at least one bit of the codeword to generate the altered version of the codeword. The operations of 1030 may be performed according to the methods described herein. In some examples, aspects of the operations of 1030 may be performed by an altering component as described with reference to FIG. 7.

At 1035, the memory device may transmit, to the host device, a second set of data that is based on an altered version of the first set of data or an altered version of the codeword. The operations of 1035 may be performed according to the methods described herein. In some examples, aspects of the operations of 1035 may be performed by a transmission component as described with reference to FIG. 7.

Figure 11:
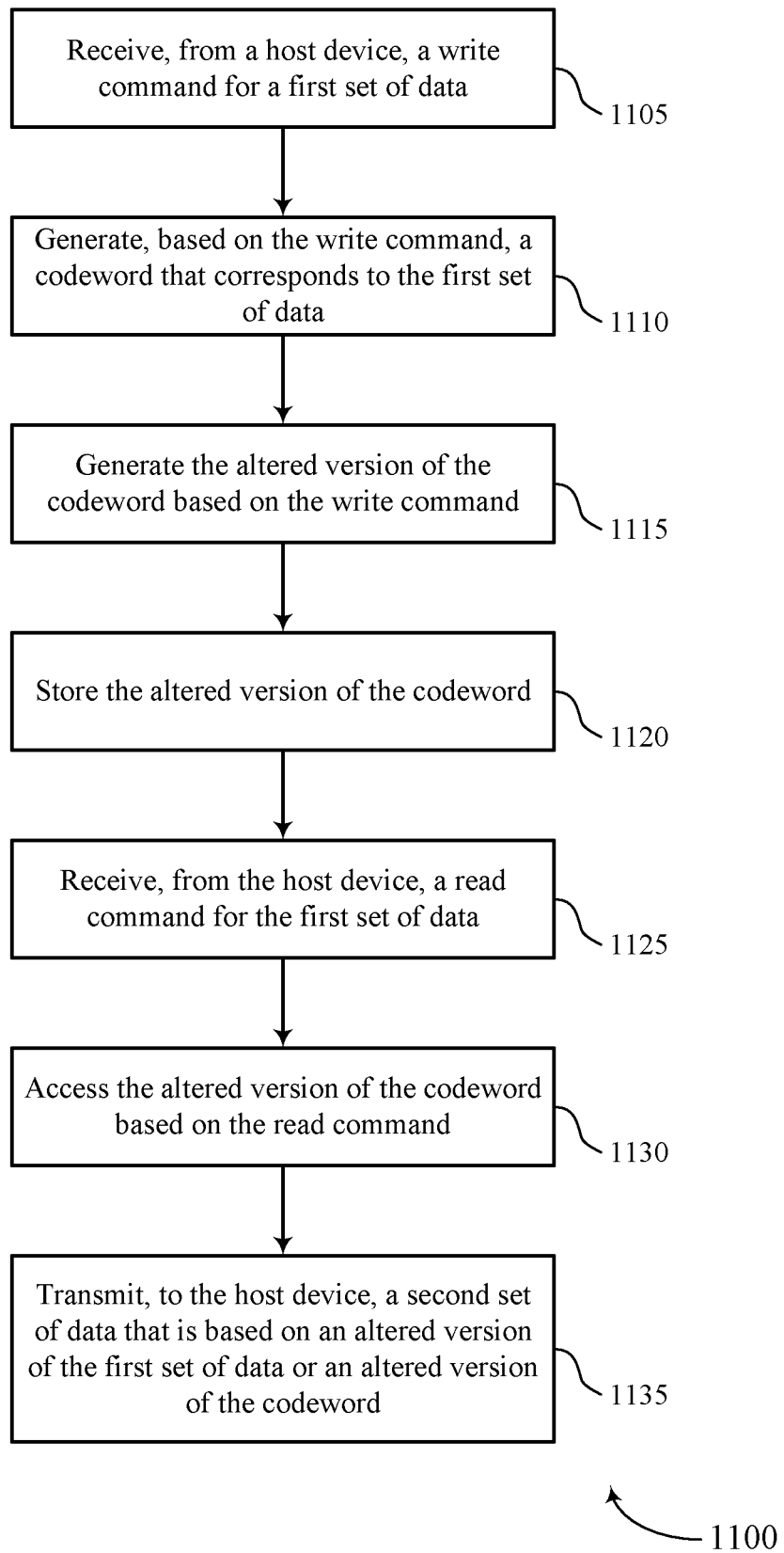

FIG. 11 shows a flowchart illustrating a method 1100 that supports error correction management as disclosed herein. The operations of method 1100 may be implemented by a memory device or its components as described herein. For example, the operations of method 1100 may be performed by a memory device as described with reference to FIG. 7. In some examples, a memory controller may execute a set of instructions to control the functional elements of the memory device to perform the described functions. Additionally or alternatively, a memory device may perform aspects of the described functions using special-purpose hardware.

At 1105, the memory device may receive, from a host device, a write command for a first set of data. The operations of 1105 may be performed according to the methods described herein. In some examples, aspects of the operations of 1105 may be performed by a reception component as described with reference to FIG. 7.

At 1110, the memory device may generate, based on the write command, a codeword that corresponds to the first set of data. The operations of 1110 may be performed according to the methods described herein. In some examples, aspects of the operations of 1110 may be performed by a generation component as described with reference to FIG. 7.

At 1115, the memory device may generate the altered version of the codeword based on the write command. The operations of 1115 may be performed according to the methods described herein. In some examples, aspects of the operations of 1115 may be performed by a generation component as described with reference to FIG. 7.

At 1120, the memory device may store the altered version of the codeword. The operations of 1120 may be performed according to the methods described herein. In some examples, aspects of the operations of 1120 may be performed by a storing component as described with reference to FIG. 7.

At 1125, the memory device may receive, from the host device, a read command for the first set of data. The operations of 1125 may be performed according to the methods described herein. In some examples, aspects of the operations of 1125 may be performed by a reception component as described with reference to FIG. 7.

At 1130, the memory device may access the altered version of the codeword based on the read command. The operations of 1130 may be performed according to the methods described herein. In some examples, aspects of the operations of 1130 may be performed by an accessing component as described with reference to FIG. 7.

At 1135, the memory device may transmit, to the host device, a second set of data that is based on an altered version of the first set of data or an altered version of the codeword. The operations of 1135 may be performed according to the methods described herein. In some examples, aspects of the operations of 1135 may be performed by a transmission component as described with reference to FIG. 7.

Figure 12:
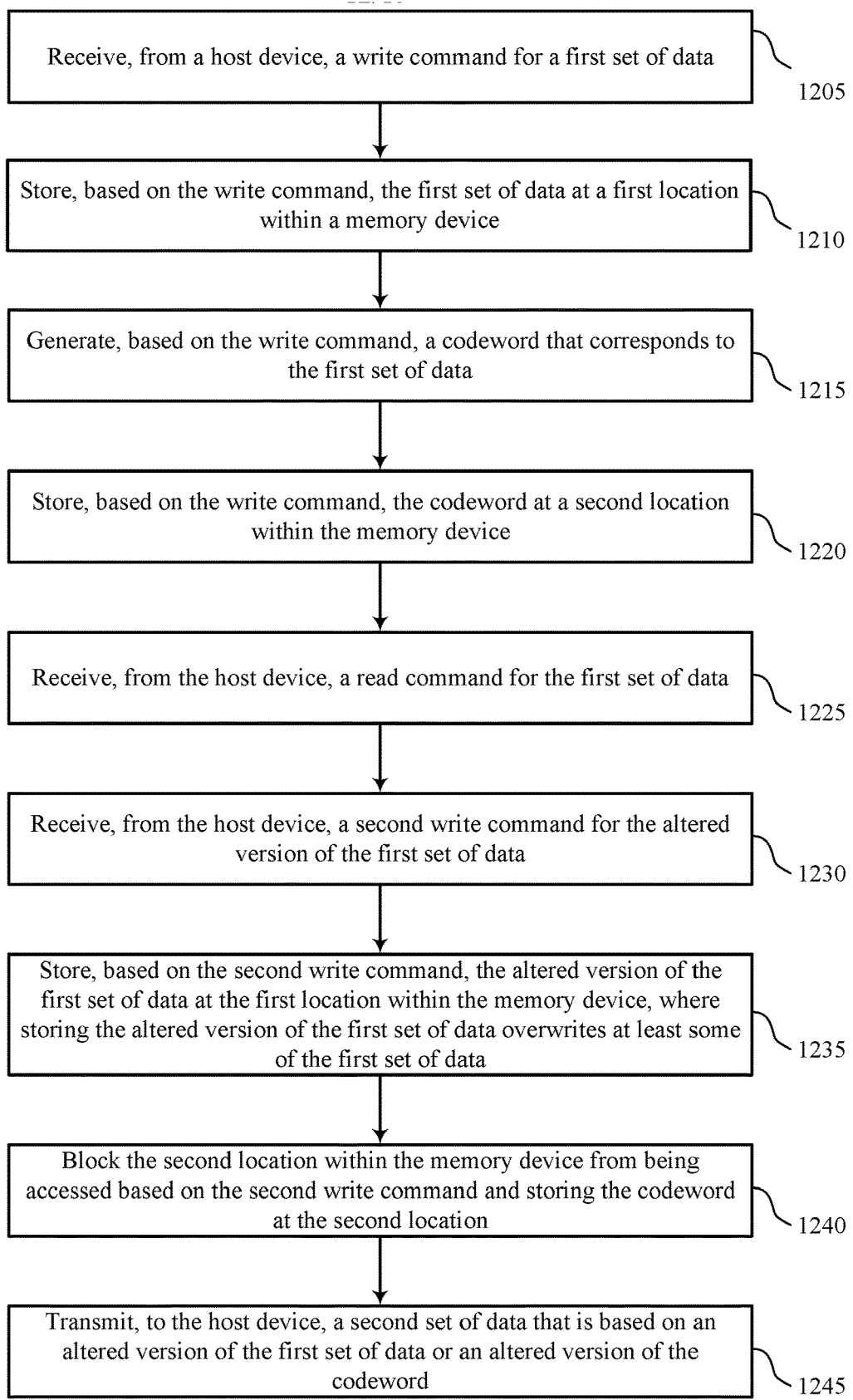

FIG. 12 shows a flowchart illustrating a method 1200 that supports error correction management as disclosed herein. The operations of method 1200 may be implemented by a memory device or its components as described herein. For example, the operations of method 1200 may be performed by a memory device as described with reference to FIG. 7. In some examples, a memory controller may execute a set of instructions to control the functional elements of the memory device to perform the described functions. Additionally or alternatively, a memory device may perform aspects of the described functions using special-purpose hardware.

At 1205, the memory device may receive, from a host device, a write command for a first set of data. The operations of 1205 may be performed according to the methods described herein. In some examples, aspects of the operations of 1205 may be performed by a reception component as described with reference to FIG. 7.

At 1210, the memory device may store, based on the write command, the first set of data at a first location within a memory device. The operations of 1210 may be performed according to the methods described herein. In some examples, aspects of the operations of 1210 may be performed by a storing component as described with reference to FIG. 7.

At 1215, the memory device may generate, based on the write command, a codeword that corresponds to the first set of data. The operations of 1215 may be performed according to the methods described herein. In some examples, aspects of the operations of 1215 may be performed by a generation component as described with reference to FIG. 7.

At 1220, the memory device may store, based on the write command, the codeword at a second location within the memory device. The operations of 1220 may be performed according to the methods described herein. In some examples, aspects of the operations of 1220 may be performed by a storing component as described with reference to FIG. 7.

At 1225, the memory device may receive, from the host device, a read command for the first set of data. The operations of 1225 may be performed according to the methods described herein. In some examples, aspects of the operations of 1225 may be performed by a reception component as described with reference to FIG. 7.

At 1230, the memory device may receive, from the host device, a second write command for the altered version of the first set of data. The operations of 1230 may be performed according to the methods described herein. In some examples, aspects of the operations of 1230 may be performed by a reception component as described with reference to FIG. 7.

At 1235, the memory device may store, based on the second write command, the altered version of the first set of data at the first location within the memory device, where storing the altered version of the first set of data overwrites at least some of the first set of data. The operations of 1235 may be performed according to the methods described herein. In some examples, aspects of the operations of 1235 may be performed by a storing component as described with reference to FIG. 7.

At 1240, the memory device may block the second location within the memory device from being accessed based on the second write command and storing the codeword at the second location. The operations of 1240 may be performed according to the methods described herein. In some examples, aspects of the operations of 1240 may be performed by a blocking component as described with reference to FIG. 7.

At 1245, the memory device may transmit, to the host device, a second set of data that is based on an altered version of the first set of data or an altered version of the codeword. The operations of 1245 may be performed according to the methods described herein. In some examples, aspects of the operations of 1245 may be performed by a transmission component as described with reference to FIG. 7.

Figure 13:
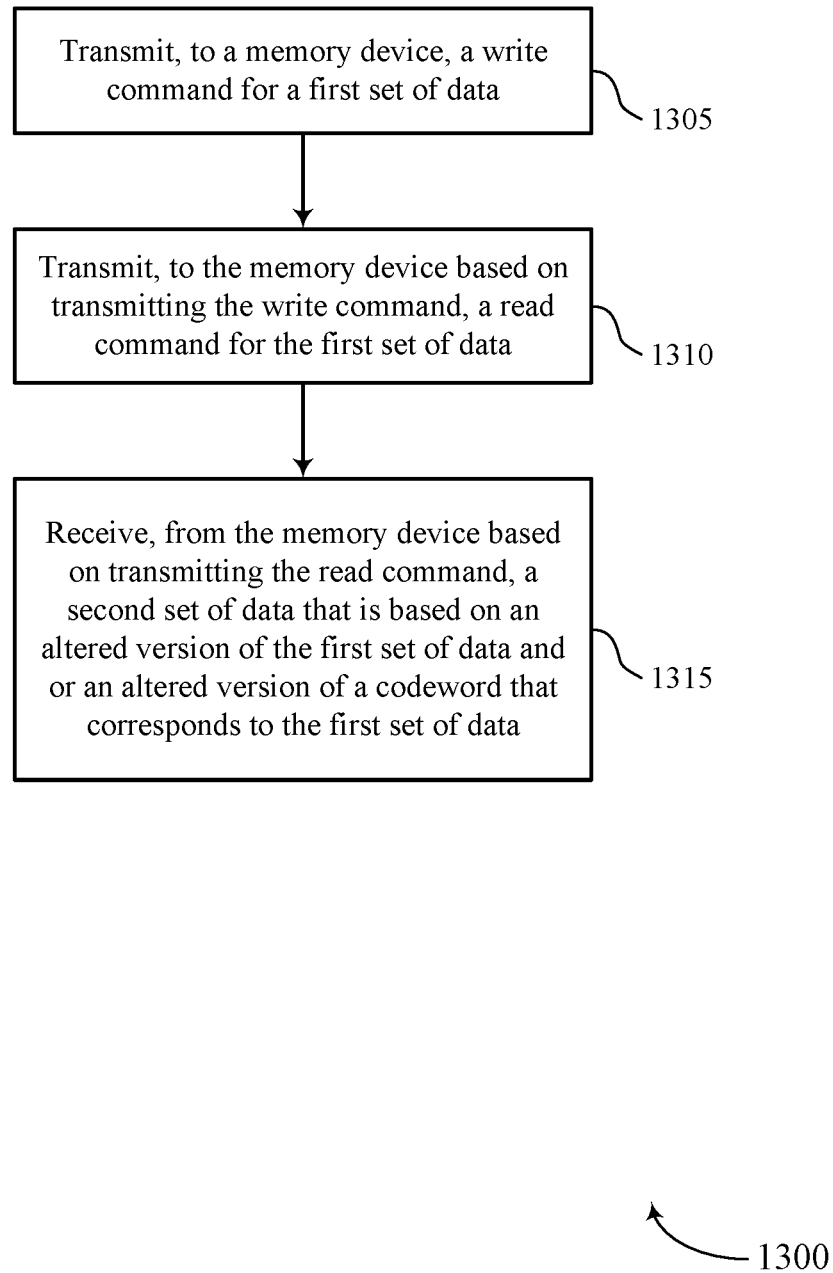

FIG. 13 shows a flowchart illustrating a method 1300 that supports error correction management as disclosed herein. The operations of method 1300 may be implemented by a host device or its components as described herein. For example, the operations of method 1300 may be performed by a host device as described with reference to FIG. 8. In some examples, a host device may execute a set of instructions to control the functional elements of the memory device to perform the described functions. Additionally or alternatively, a host device may perform aspects of the described functions using special-purpose hardware.

At 1305, the host device may transmit, to a memory device, a write command for a first set of data. The operations of 1305 may be performed according to the methods described herein. In some examples, aspects of the operations of 1305 may be performed by a transmission component as described with reference to FIG. 8.

At 1310, the host device may transmit, to the memory device based on transmitting the write command, a read command for the first set of data. The operations of 1310 may be performed according to the methods described herein. In some examples, aspects of the operations of 1310 may be performed by a transmission component as described with reference to FIG. 8.

At 1315, the host device may receive, from the memory device based on transmitting the read command, a second set of data that is based on an altered version of the first set of data or an altered version of a codeword that corresponds to the first set of data. The operations of 1315 may be performed according to the methods described herein. In some examples, aspects of the operations of 1315 may be performed by a reception component as described with reference to FIG. 8.

In some examples, an apparatus as described herein may perform a method or methods, such as method 1300. The apparatus may include features, means, or instructions (e.g., a non-transitory computer-readable medium storing instructions executable by a processor) for transmitting, to a memory device, a write command for a first set of data, transmitting, to the memory device based at least in part on transmitting the write command, a read command for the first set of data, and receiving, from the memory device based at least in part on transmitting the read command, a second set of data that is based at least in part on an altered version of the first set of data or an altered version of a codeword that corresponds to the first set of data.

Some examples of the methods, apparatuses, and non-transitory computer-readable medium described herein may further include operations, features, means, or instructions for determining that the second set of data is different than the first set of data and determining that the memory device has committed an error based at least in part on the second set of data being different than the first set of data.

Some examples of the methods, apparatuses, and non-transitory computer-readable medium described herein may further include operations, features, means, or instructions for transmitting one or more commands to the memory device based at least in part on determining that the memory device has committed the error.

Some examples of the methods, apparatuses, and non-transitory computer-readable medium described herein may further include operations, features, means, or instructions for determining that the second set of data is identical to the first set of data and determining that the memory device has committed an error based at least in part on the second set of data being identical to the first set of data.

Some examples of the methods, apparatuses, and non-transitory computer-readable medium described herein may further include operations, features, means, or instructions for transmitting one or more commands to the memory device based at least in part on determining that the memory device has committed the error.

Some examples of the methods, apparatuses, and non-transitory computer-readable medium described herein may further include operations, features, means, or instructions for transmitting, to the memory device, a second write command that indicates the altered version of the first set of data, wherein transmitting the read command occurs after transmitting the second write command.

Some examples of the methods, apparatuses, and non-transitory computer-readable medium described herein may further include operations, features, means, or instructions for transmitting, to the memory device, a command to enter a mode of operation for testing error correcting functionality, wherein receiving the second set of data is based at least in part the mode of operation.

Figure 14:
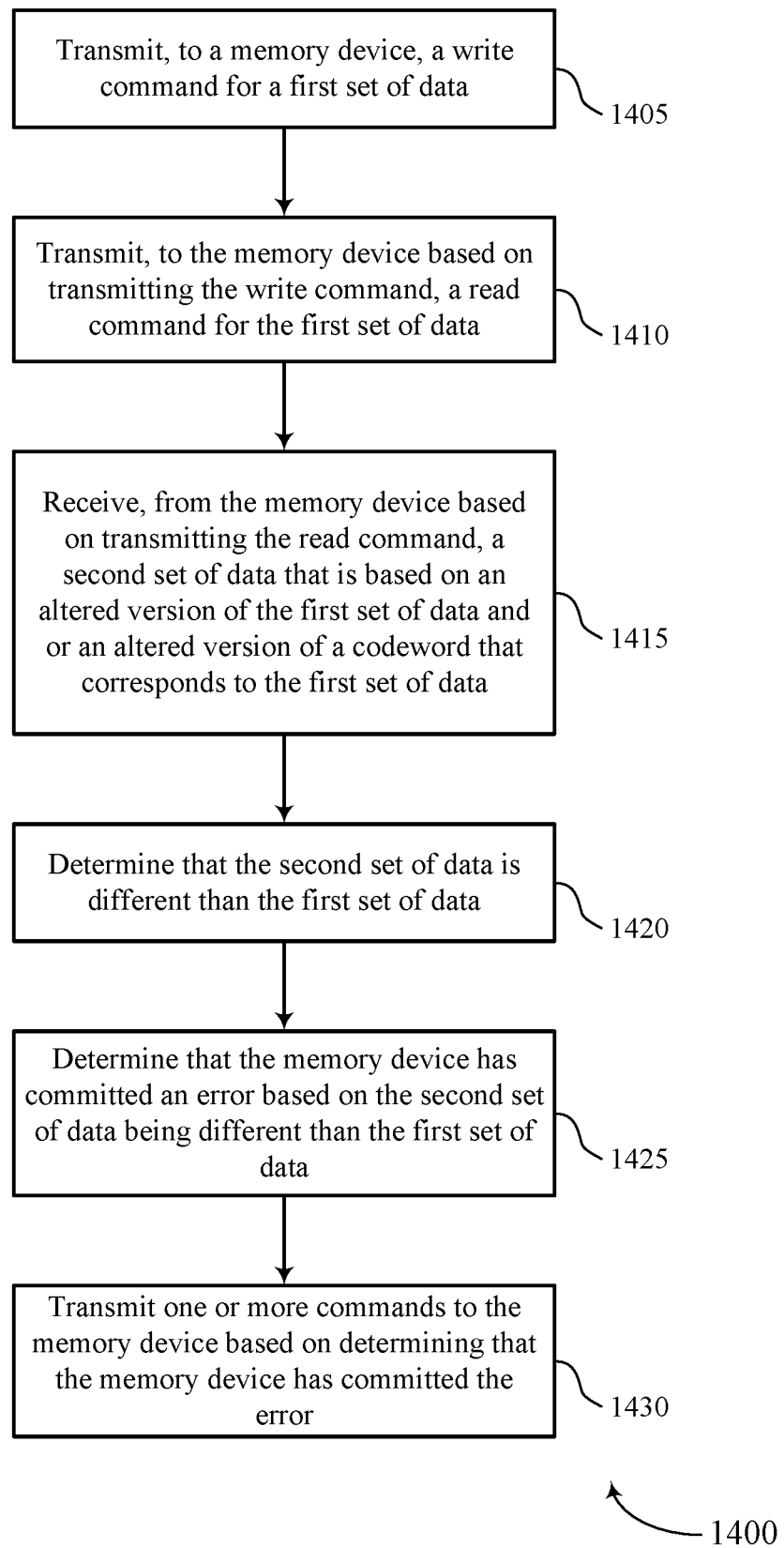

FIG. 14 shows a flowchart illustrating a method 1400 that supports error correction management as disclosed herein. The operations of method 1400 may be implemented by a host device or its components as described herein. For example, the operations of method 1400 may be performed by a host device as described with reference to FIG. 8. In some examples, a host device may execute a set of instructions to control the functional elements of the memory device to perform the described functions. Additionally or alternatively, a host device may perform aspects of the described functions using special-purpose hardware.

At 1405, the host device may transmit, to a memory device, a write command for a first set of data. The operations of 1405 may be performed according to the methods described herein. In some examples, aspects of the operations of 1405 may be performed by a transmission component as described with reference to FIG. 8.

At 1410, the host device may transmit, to the memory device based on transmitting the write command, a read command for the first set of data. The operations of 1410 may be performed according to the methods described herein. In some examples, aspects of the operations of 1410 may be performed by a transmission component as described with reference to FIG. 8.

At 1415, the host device may receive, from the memory device based on transmitting the read command, a second set of data that is based on an altered version of the first set of data or an altered version of a codeword that corresponds to the first set of data. The operations of 1415 may be performed according to the methods described herein. In some examples, aspects of the operations of 1415 may be performed by a reception component as described with reference to FIG. 8.

At 1420, the host device may determine that the second set of data is different than the first set of data. The operations of 1420 may be performed according to the methods described herein. In some examples, aspects of the operations of 1420 may be performed by a determination component as described with reference to FIG. 8.

At 1425, the host device may determine that the memory device has committed an error based on the second set of data being different than the first set of data. The operations of 1425 may be performed according to the methods described herein. In some examples, aspects of the operations of 1425 may be performed by a determination component as described with reference to FIG. 8.

At 1430, the host device may transmit one or more commands to the memory device based on determining that the memory device has committed the error. The operations of 1430 may be performed according to the methods described herein. In some examples, aspects of the operations of 1430 may be performed by a transmission component as described with reference to FIG. 8.

Figure 15:
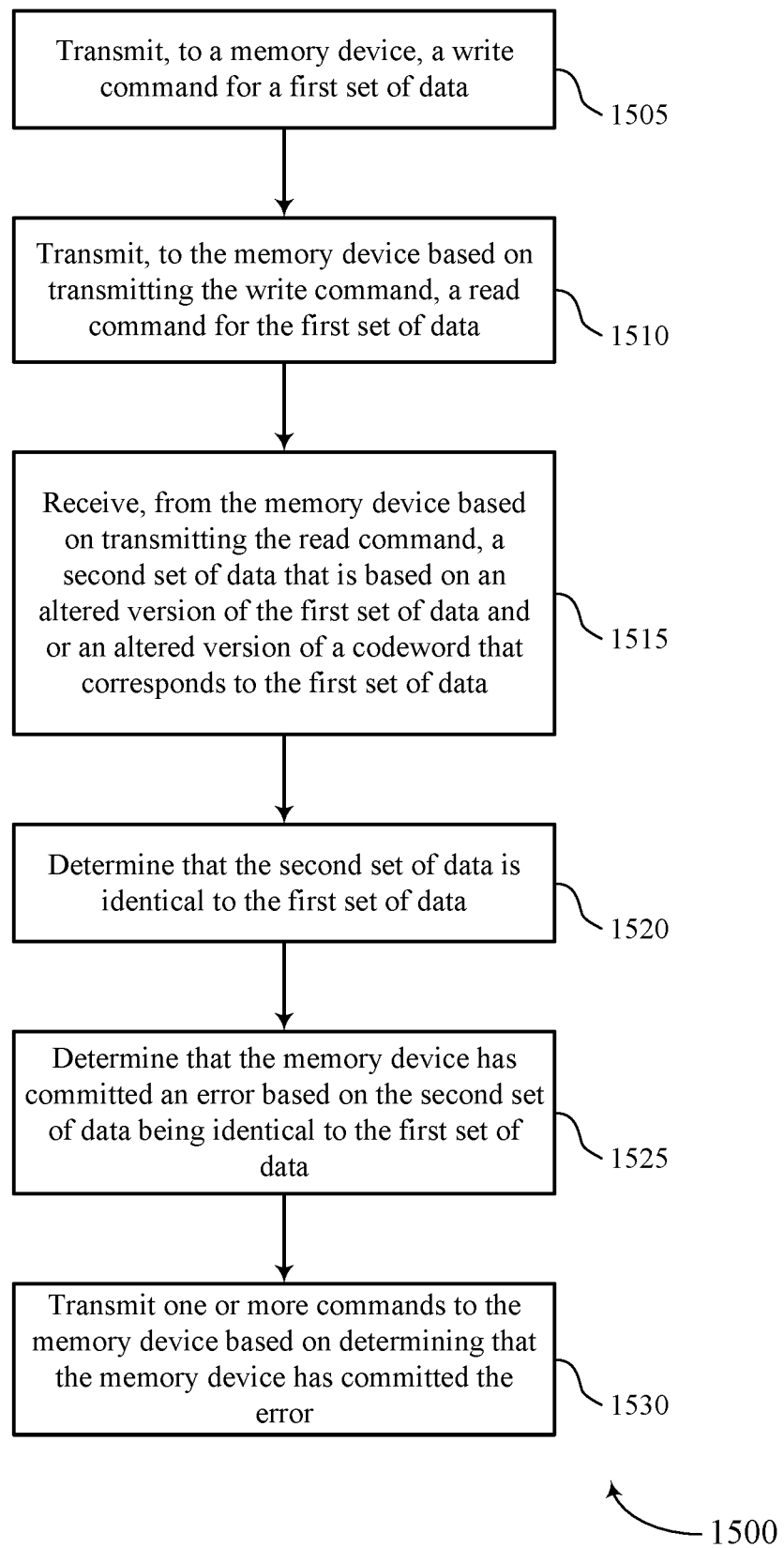

FIG. 15 shows a flowchart illustrating a method 1500 that supports error correction management as disclosed herein. The operations of method 1500 may be implemented by a host device or its components as described herein. For example, the operations of method 1500 may be performed by a host device as described with reference to FIG. 8. In some examples, a host device may execute a set of instructions to control the functional elements of the memory device to perform the described functions. Additionally or alternatively, a host device may perform aspects of the described functions using special-purpose hardware.

At 1505, the host device may transmit, to a memory device, a write command for a first set of data. The operations of 1505 may be performed according to the methods described herein. In some examples, aspects of the operations of 1505 may be performed by a transmission component as described with reference to FIG. 8.

At 1510, the host device may transmit, to the memory device based on transmitting the write command, a read command for the first set of data. The operations of 1510 may be performed according to the methods described herein. In some examples, aspects of the operations of 1510 may be performed by a transmission component as described with reference to FIG. 8.

At 1515, the host device may receive, from the memory device based on transmitting the read command, a second set of data that is based on an altered version of the first set of data or an altered version of a codeword that corresponds to the first set of data. The operations of 1515 may be performed according to the methods described herein. In some examples, aspects of the operations of 1515 may be performed by a reception component as described with reference to FIG. 8.

At 1520, the host device may determine that the second set of data is identical to the first set of data. The operations of 1520 may be performed according to the methods described herein. In some examples, aspects of the operations of 1520 may be performed by a determination component as described with reference to FIG. 8.

At 1525, the host device may determine that the memory device has committed an error based on the second set of data being identical to the first set of data. The operations of 1525 may be performed according to the methods described herein. In some examples, aspects of the operations of 1525 may be performed by a determination component as described with reference to FIG. 8.

At 1530, the host device may transmit one or more commands to the memory device based on determining that the memory device has committed the error. The operations of 1530 may be performed according to the methods described herein. In some examples, aspects of the operations of 1530 may be performed by a transmission component as described with reference to FIG. 8.

It should be noted that the methods described herein describe possible implementations, and that the operations and the steps may be rearranged or otherwise modified and that other implementations are possible. Furthermore, aspects from two or more of the methods may be combined.

In some examples, an apparatus or device may perform aspects of the functions described herein. The device may include a first set of memory cells to store data, a second set of memory cells to store codewords associated with the data, an encoder coupled with the second set of memory cells and to generate the codewords associated with the data, and circuitry coupled with the second set of memory cells. In some examples, the circuitry may determine that the apparatus is configured in a first mode of operation or a second mode of operation, propagate a first codeword generated by the encoder to the second set of memory cells when the apparatus is configured in the first mode of operation and discard or alter a second codeword generated by the encoder when the apparatus is configured in the second mode of operation.

In some examples, the circuitry may invert at least one bit of the second codeword based at least in part on a read command or a write command for a set of data associated with the second codeword.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, conductive material, or the like that provides a conductive path between elements or components of memory array.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise random access memory (RAM), ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
   switching from operating according to a first mode of operation to operating according to a second mode of operation, wherein the second mode of operation is for testing error correcting functionality;
   receiving, from a host device, a first command to write a first set of data;
   generating a codeword based at least in part on the first command and the first set of data;
   receiving, from the host device, a second command to read the first set of data;
   altering the codeword corresponding to the first set of data based at least in part on operating according to the second mode of operation;
   transmitting, to the host device, a second set of data different than the first set of data in response to the second command and based at least in part on altering the codeword; and validating functionality of an operation for error correction based at least in part on the second set of data being different than the first set of data.

2. The method of claim 1, further comprising:
receiving, from the host device, a third command to switch from the first mode of operation to the second mode of operation, wherein switching from operating according to the first mode of operation to operating according to the second mode of operation is based at least in part on the third command.

3. The method of claim 1, further comprising:
reading, from a mode register at a memory device, respective logic states of one or more bits stored at the mode register, wherein switching from operating according to the first mode of operation to operating according to the second mode of operation is based at least in part on the respective logic states of the one or more bits.

4. The method of claim 1, further comprising:
identifying an event triggering a switch to the second mode of operation, the event comprising a boot of a memory device or a reboot of the memory device, wherein switching from operating according to the first mode of operation to operating according to the second mode of operation is based at least in part on identifying the event.

5. The method of claim 1, further comprising:
switching from operating according to the second mode of operation to operating according to the first mode of operation; and
initiating a timer based at least in part on switching from operating according to the second mode of operation to operating according to the first mode of operation, wherein switching from operating according to the first mode of operation to operating according to the second mode of operation is based at least in part on an expiration of the timer.

6. The method of claim 1, further comprising:
identifying a periodicity associated with the second mode of operation, wherein switching from operating according to the first mode of operation to operating according to the second mode of operation is based at least in part on the periodicity.

7. The method of claim 1, further comprising:
writing the codeword to a memory device based at least in part on the generating; and
accessing the codeword based at least in part on the second command, wherein altering the codeword comprises altering, based at least in part on accessing the codeword, at least one bit of the codeword to generate an altered version of the codeword.

8. The method of claim 1, further comprising:
generating an altered version of the codeword based at least in part on the first command and the first set of data;
writing the altered version of the codeword to a memory device based at least in part on the generating; and
accessing the altered version of the codeword based at least in part on the second command.

9. A method, comprising:
switching from operating according to a first mode of operation to operating according to a second mode of operation, wherein the second mode of operation is for testing error correcting functionality;
receiving, from a host device, a first command to write a first set of data;
writing, based at least in part on the first command, the first set of data to a first location within a memory device;
receiving, from the host device, a third command to write an altered version of the first set of data;
altering the first set of data or a codeword corresponding to the first set of data based at least in part on operating according to the second mode of operation;
writing, based at least in part on the third command, the altered version of the first set of data to the first location within the memory device, wherein writing the altered version of the first set of data overwrites at least some of the first set of data;
receiving, from the host device, a second command to read the first set of data; and
transmitting, to the host device, a second set of data in response to the second command and based at least in part on altering the first set of data or the codeword.

10. The method of claim 9, further comprising:
writing, based at least in part on the first command, the codeword to a second location within the memory device; and
blocking the second location within the memory device from being accessed in response to the third command and based at least in part on writing the codeword to the second location.

11. The method of claim 9, further comprising:
generating, based at least in part on the third command, a second codeword that corresponds to the altered version of the first set of data; and
refraining from writing the second codeword to the memory device based at least in part on operating according to the second mode of operation.

12. The method of claim 1, further comprising:
inverting a logic state of at least one bit of the first set of data or the codeword, wherein altering the codeword comprises inverting the logic state of the at least one bit of the codeword.

13. The method of claim 1, further comprising:
performing the operation for error correction based at least in part on the second command, wherein performing the operation for error correction comprises generating the second set of data based at least in part on the altered codeword; and
transmitting one or more commands to the host device based at least in part on the operation for error correction.

14. A method, comprising:
transmitting, to a memory device, a first command to switch from a first mode of operation to a second mode of operation, wherein the second mode of operation is for testing error correcting functionality;
transmitting, to the memory device, a second command to write a first set of data;
transmitting, to the memory device, a third command to read the first set of data based at least in part on transmitting the first command to switch the memory device to the second mode of operation;
receiving, from the memory device and in response to the third command, a second set of data different than the first set of data, the second set of data based at least in part on an altered version of a codeword corresponding to the first set of data, wherein receiving the second set of data is based at least in part on transmitting the first command to switch the memory device to the second mode of operation; and validating functionality of an operation for error correction based at least in part on the second set of data being different than the first set of data.

15. The method of claim 14, further comprising:
setting one or more bits stored at a mode register of the memory device to a respective logic state corresponding to the second mode of operation based at least in part on the first command to switch the memory device to the second mode of operation.

16. The method of claim 14, further comprising:
determining that the second set of data is different than the first set of data, wherein validating functionality of the operation for error correction is based at least in part on determining that the second set of data is different than the first set of data.

17. The method of claim 14, further comprising:
transmitting, to the memory device, a fourth command to write an altered version of the first set of data, wherein transmitting the third command occurs after transmitting the fourth command.

18. An apparatus, comprising:
a first array of memory cells to store data;
a second array of memory cells to store codewords associated with the data;
an encoder coupled with the second array of memory cells and configured to generate the codewords associated with the data; and
logic coupled with the first array of memory cells and the second array of memory cells and operable to cause the apparatus to:
switch from operating according to a first mode of operation to operating according to a second mode of operation, wherein the second mode of operation is for testing error correcting functionality;
receive first signaling indicative of a first command to write a first set of data to the first array of memory cells;
generate a codeword based at least in part on the first command and the first set of data;
receive second signaling indicative of a second command to read the first set of data from the first array of memory cells;
alter the codeword generated by the encoder and corresponding to the first set of data based at least in part on operating according to the second mode of operation;
transmit third signaling indicative of a second set of data different than the first set of data in response to the second command and based at least in part on altering the codeword; and
validate functionality of an operation for error correction based at least in part on the second set of data being different than the first set of data.

19. The apparatus of claim 18, wherein the logic is further operable to cause the apparatus to:
invert at least one bit of the first set of data or the codeword based at least in part on altering the first set of data or the codeword.

* * * * *